(12) United States Patent
Tanaka et al.

(10) Patent No.: US 7,763,898 B2
(45) Date of Patent: Jul. 27, 2010

(54) LIGHT EMITTING DEVICE HAVING HIGH OPTICAL OUTPUT EFFICIENCY

(75) Inventors: Satoshi Tanaka, Machida (JP);
Naochika Horio, Yokohama (JP);
Masahiko Tsuchiya, Kamakura (JP)

(73) Assignee: Stanley Electric Co., Ltd. (JP)

( * ) Notice: Subject to any disclaimer, the term of this patent is extended or adjusted under 35 U.S.C. 154(b) by 349 days.

(21) Appl. No.: 11/589,297

(22) Filed: Oct. 30, 2006

(65) Prior Publication Data

US 2007/0131941 A1  Jun. 14, 2007

(30) Foreign Application Priority Data

Oct. 31, 2005 (JP) ............................. 2005-317308

(51) Int. Cl.
H01L 27/15 (2006.01)
H01L 29/18 (2006.01)
H01L 31/12 (2006.01)
H01L 33/00 (2006.01)

(52) U.S. Cl. ........................... 257/87; 257/98; 257/102; 438/42; 438/43

(58) Field of Classification Search ................... 257/13, 257/79–103, 919; 438/42, 43
See application file for complete search history.

(56) References Cited

U.S. PATENT DOCUMENTS 6,885,034 B1    4/2005  Schoenfeld
2003/0010980 A1*  1/2003  Yamazaki et al. ............. 257/65
2005/0225238 A1* 10/2005  Yamazaki .................... 313/506

* cited by examiner

Primary Examiner—Mary Wilczewski
Assistant Examiner—Telly D Green
(74) Attorney, Agent, or Firm—Chen Yoshimura LLP

(57) ABSTRACT

A light emitting device includes a lower semiconductor layer of a first conductivity type; an optical emission layer formed on said lower semiconductor layer; an upper semiconductor layer of a second conductivity type opposite to said first conductivity type, said upper semiconductor layer being formed on said optical emission layer; a lower side electrode electrically connected to said lower semiconductor layer; and an upper side electrode electrically connected to said upper semiconductor layer, wherein said upper side electrode is formed on said upper semiconductor layer, and said upper semiconductor layer has a mesh pattern defining a plurality of sections each surrounded by said upper side electrode, and wherein at least one dent is disposed in at least one of said sections, said dent having a bottom reaching at least an upper surface of said lower semiconductor layer and having an opening with an upper edge spaced apart from said upper side electrode.

27 Claims, 23 Drawing Sheets

205b 205a 206
205

206
205a 205A  205aA  206A

206A

LAT

Fig. 16

| SAMPLE | OPTICAL EMISSION WAVELENGTH (nm) | OUTPUT (%) |
|---|---|---|
| COMPARATIVE EXAMPLE | 480 | 100 |
| 1ST EMBODIMENT | 478 | 140 |
| 2ND EMBODIMENT | 481 | 145 |
| 3RD EMBODIMENT | 479 | 170 |
| 4TH EMBODIMENT | 480 | 240 |
| 5TH EMBODIMENT | 482 | 210 |
| 6TH EMBODIMENT | 480 | 120 |

# LIGHT EMITTING DEVICE HAVING HIGH OPTICAL OUTPUT EFFICIENCY

CROSS REFERENCE TO RELATED APPLICATION

This application is based on and claims priority of Japanese Patent Application No. 2005-317308 filed on Oct. 31, 2005, the entire contents of which are incorporated herein by reference.

BACKGROUND OF THE INVENTION

A) Field of the Invention

The present invention relates to a semiconductor light emitting device and its manufacture method.

B) Description of the Related Art

With reference to FIG. 22, description will be made on a light emitting device disclosed in U.S. Pat. No. 6,885,034. A semiconductor layer 1028 is formed on a substrate 1014, with a low resistance semiconductor layer 1018 being interposed therebetween. An electrode is connected to the semiconductor layer 1018. A reflection layer 1015 is formed on the bottom surface of the substrate 1014. An optical emission layer 1026 is formed on the semiconductor layer 1028, and a semiconductor layer 1027 is formed on the optical emission layer 1026. The semiconductor layers 1028 and 1027 have opposite conductivity types.

Dents 1030 are formed through the semiconductor layer 1027 and optical emission layer 1026 to expose the semiconductor layer 1028 on the bottom of the dents 1030. A translucent electrode layer 1024 of NiO/Au is formed covering the upper surface of the semiconductor layer 1027. The translucent electrode layer 1024 is not formed on the inner surfaces of the dents 1030.

After the translucent electrode layer 1024 is formed on the semiconductor layer 1027, the translucent electrode layer 1024, semiconductor layer 1027, optical emission layer 1026 and semiconductor layer 1028 are removed by reactive ion etching to form the dents 1030.

Light radiated from the optical emission layer 1026 propagates through the translucent electrode layer 1024 or through the insides of the dents 1030 and is outputted to the space above the light emitting device. Light passing through the translucent electrode layer 1024 is partially absorbed therein. Light output from the insides of the dents 1030 is not absorbed in the translucent electrode layer 1024. Therefore, the dents 1030 increase the amount of light to be output from the light emitting device.

Next, with reference to FIGS. 20A and 20B, description will be made on a light emitting device having a lattice electrode. FIG. 20A is a schematic plan view of the light emitting device.

This light emitting device has an n-type nitride semiconductor layer 102, an optical emission layer 103 formed on the n-type nitride semiconductor layer 102, and a p-type nitride semiconductor layer 104 formed on the optical emission layer 103. An optical emission region 950 is defined on the surface of the p-type nitride semiconductor layer 104, the optical emission region 950 having a square shape with a recessed central area along one side thereof. The p-type nitride semiconductor layer 104 and optical emission layer 103 and a surface layer of the n-type nitride semiconductor layer 102 are removed from an area surrounding the optical emission region 950, to thereby form a recess 911 exposing the n-type nitride semiconductor layer 102 on the bottom of the recess.

A p-side electrode 905 is formed on the optical emission area 950. The p-side electrode 905 is constituted of a lattice portion 905a and a p-side pad portion 905b. The lattice portion 905a has a lattice structure. The p-side pad portion 905b is formed in a central area of the side opposing the recessed side, covering the lattice portion 905a. An n-side electrode 907 is formed on the bottom of the recess 911. The n-side electrode 907 is disposed in a recessed area of the optical emission region 950. The n-side electrode 907 is used as a pad.

As a predetermined voltage is applied across the p-side electrode 905 and n-side electrode 907, light is emitted from the optical emission layer 103. The material used for the p-side electrode 905 may not be transparent to light emitted from the optical emission layer 103. Light can be output to an exterior of the light emitting device from the upper surface of the device where the p-side electrode 905 is not formed.

In the light emitting device of U.S. Pat. No. 6,885,034, the upper surface of the semiconductor layer 1027 where the dents 1030 are not formed, is covered with the translucent electrode layer 1024. Light to be passed through the translucent electrode layer 1024 and to be output to the exterior is attenuated by absorption in the translucent electrode layer 1024. It is therefore difficult to improve an optical output efficiency.

In the light emitting device described with reference to FIG. 20A, a strong electric field is likely to be generated near the n-side electrode 907, and current is likely to flow at a high current density. As current flows at a high current density, the optical emission layer is likely to be degraded.

SUMMARY OF THE INVENTION

An object of the present invention is to provide a light emitting device capable of improving an optical output efficiency and having a novel structure, and its manufacture method.

Another object of the present invention is to provide a light emitting device suppressing current concentration upon a region of a semiconductor layer.

According to a first aspect of the present invention, there is provided a light emitting device including a lower semiconductor layer of a first conductivity type; an optical emission layer formed on said lower semiconductor layer; an upper semiconductor layer of a second conductivity type opposite to said first conductivity type, said upper semiconductor layer being formed on said optical emission layer; a lower side electrode electrically connected to said lower semiconductor layer; and an upper side electrode electrically connected to said upper semiconductor layer, wherein said upper side electrode is formed on said upper semiconductor layer, and said upper semiconductor layer has a mesh pattern defining a plurality of sections each surrounded by said upper side electrode, and wherein at least one dent is disposed in at least one of said sections, said dent having a bottom reaching at least an upper surface of said lower semiconductor layer and having an opening with an upper edge spaced apart from said upper side electrode.

According to a second aspect of the present invention, there is provided a light emitting device including a first region including a support layer, a lower semiconductor layer of a first conductivity type, formed above said support layer and having a resistivity lower than a resistivity of said support layer, an optical emission layer formed over said lower semiconductor layer, an upper semiconductor layer of a second conductivity type opposite to said first conductivity type, the upper semiconductor layer being formed over said optical emission layer, and an upper side electrode formed on said upper semiconductor layer; a second region including said support layer, said lower semiconductor layer formed above said support layer, and a first portion of a lower side electrode formed on said lower semiconductor layer; and a third region including said support layer and a second portion of said lower side electrode formed on said support layer.

According to a third aspect of the present invention, there is provided a manufacture method for a light emitting device, the method including (a) preparing a wafer including a lower semiconductor layer of a first conductivity type, an optical emission layer formed over said lower semiconductor layer, and an upper semiconductor layer of a second conductivity type opposite to said first conductivity type, said upper semiconductor layer being formed over said optical emission layer; (b) selectively etching at least said upper semiconductor layer and said optical emission layer to form dents; (c) after said step (b), forming an upper side electrode on said upper semiconductor layer, said upper side electrode having a pattern surrounding an opening of said dent; and (d) after said step (b), forming a lower side electrode electrically connected to said lower semiconductor layer.

According to the light emitting device of the first aspect, the dent is formed in each section defined by the upper side electrode. Because the dent removes a portion of the optical emission layer that does not contribute to optical emission, but absorbs the emitted light, among other benefits, the optical output efficiency can be improved.

According to the light emitting device of the second aspect, the first portion of the lower side electrode is formed on the lower semiconductor layer, and the second portion is formed on the support layer having a resistivity higher than that of the lower semiconductor layer. It is therefore possible to suppress concentration of current upon a region near the second portion of the lower side electrode.

According to the manufacture method for a light emitting device of the third aspect, the upper side electrode and lower side electrode are formed after the dents are formed. It is therefore possible to prevent electrode material from attaching the sidewalls of the dents during a dent forming process.

BRIEF DESCRIPTION OF THE DRAWINGS

FIG. 16 is a table collectively showing optical emission wavelengths and optical emission outputs of light emitting devices of the first to sixth embodiments and a comparative example.

DESCRIPTION OF THE PREFERRED EMBODIMENTS

Figure 1A:
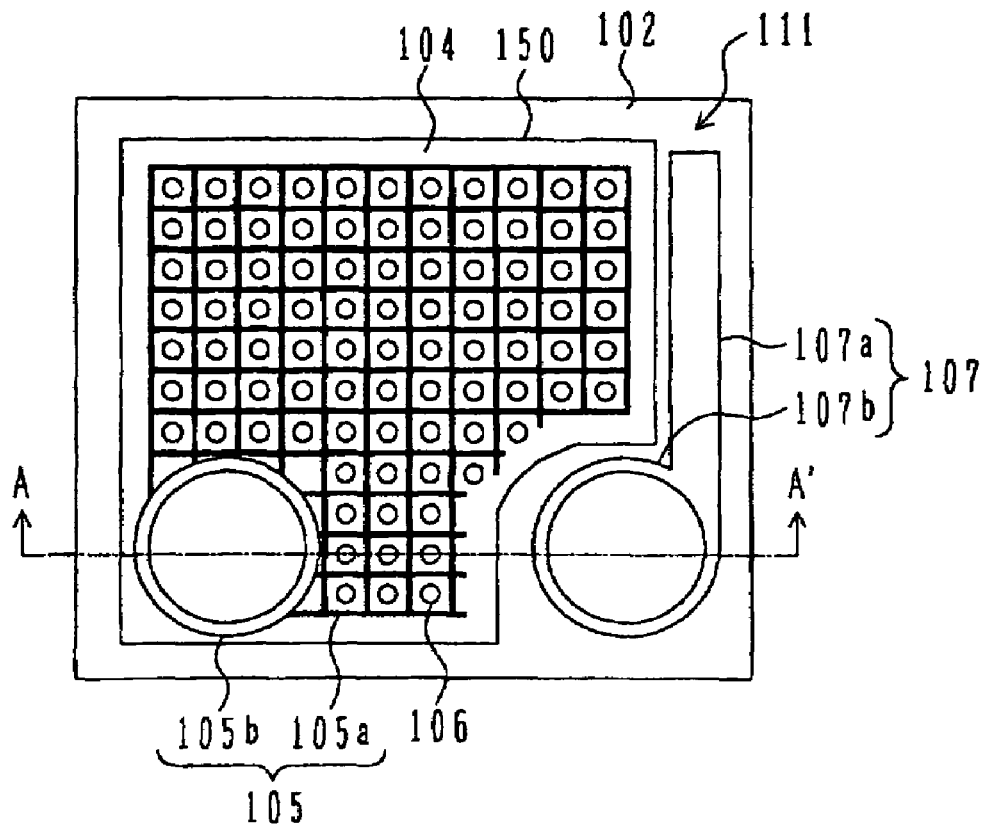
FIG. 1A is a schematic plan view of a light emitting device according to a first embodiment.

First, with reference to FIG. 19, description will be made on a nitride semiconductor wafer that may be used as the material of a light emitting device according to an embodiment of the present invention. A buffer layer 101 is formed on a substrate 100. The substrate 100 is made of, for example, sapphire, silicon nitride, silicon, gallium oxide, zinc oxide or the like.

An n-type contact layer 102a made of n-type nitride semiconductor (e.g., gallium nitride) is formed on the buffer layer 101, and an n-type clad layer 102b made of n-type nitride semiconductor (e.g., aluminum-gallium nitride) is formed on the n-type contact layer 102a. The n-type contact layer 102a and n-type clad layer 102b constitute an n-type nitride semiconductor layer 102.

An optical emission layer 103 is formed on the n-type clad layer 102b. For example, the optical emission layer 103 is made of indium-gallium nitride. The optical emission layer 103 may have any known structure, e.g., a single thick layer or a multi quantum well (MQW) structure laminating thin films.

A p-type clad layer 104b made of p-type nitride semiconductor (e.g., aluminum-gallium nitride) is formed on the optical emission layer 103, and a p-type contact layer 104a made of p-type nitride semiconductor (e.g., gallium nitride) is formed on the p-type clad layer 104b. The p-type contact layer 104a and p-type clad layer 104b constitute a p-type nitride semiconductor layer 104.

The p-type nitride semiconductor layer 104, optical emission layer 103, n-type nitride semiconductor layer 102 and buffer layer 101 are collectively called a nitride semiconductor layer. A thickness of the nitride semiconductor layer is, for example, 4.60 µm. A total thickness of the p-type nitride semiconductor layer 104 and optical emission layer 103 is, for example, 0.35 µm. A thickness of the substrate 100 is, for example, 300 to 500 µm. A sapphire substrate having a thickness of, e.g., 330 µm or 430 µm is commercially available.

Generally, there is a variety of lamination structures of a nitride semiconductor wafer to be used for a light emitting device. There are three functional layers essential for forming a light emitting device: an n-type nitride semiconductor layer; an optical emission layer; and a p-type nitride semiconductor layer.

The nitride semiconductor wafer may include other functional layers. An example of other functional layers is a strain relaxing layer inserted between the n-type contact layer and n-type clad layer. The strain relaxing layer may be an InGaN layer, a super lattice layer of $(InGaN/GaN)_n$ or a super lattice layer of $(AlGaN/InGaN)_n$. Further, there is a case in which an undoped GaN layer as a defect reduction layer is inserted between the n-type clad layer and optical emission layer.

The n-type clad layer 102b and p-type clad layer 104b are formed in order to suppress leak of carriers from the optical emission layer 103. These layers may not be necessarily required in terms of functionally. The n-type clad layer 102b may be omitted from the n-type nitride semiconductor layer and the p-type clad layer 104b may be omitted from the p-type nitride semiconductor layer. A nitride semiconductor wafer not having a buffer layer has also been researched.

Each layer on or over the substrate can be formed, for example, metal organic chemical vapor deposition (MOCVD), molecular beam epitaxy (MBE), metal organic molecular beam epitaxy (MOMBE), vapor phase epitaxy (VPE) or the like.

Next, with reference to FIGS. 1A and 1B, description will be made on a light emitting device according to a first embodiment of the present invention.

Figure 1B:
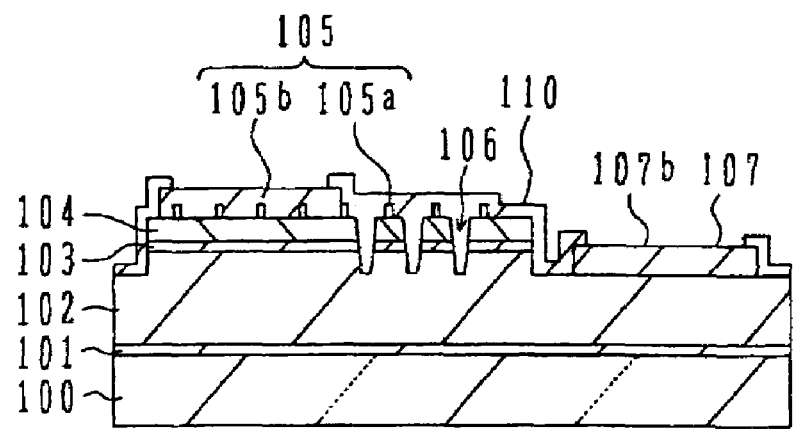
FIG. 1B is a schematic cross sectional view taken along line A-A' shown in FIG. 1A.

FIG. 1A is a schematic plan view of the light emitting device according to the first embodiment, and FIG. 1B is a schematic cross sectional view of the light emitting device of the first embodiment taken along the line A-A' shown in FIG. 1A.

Figure 19:
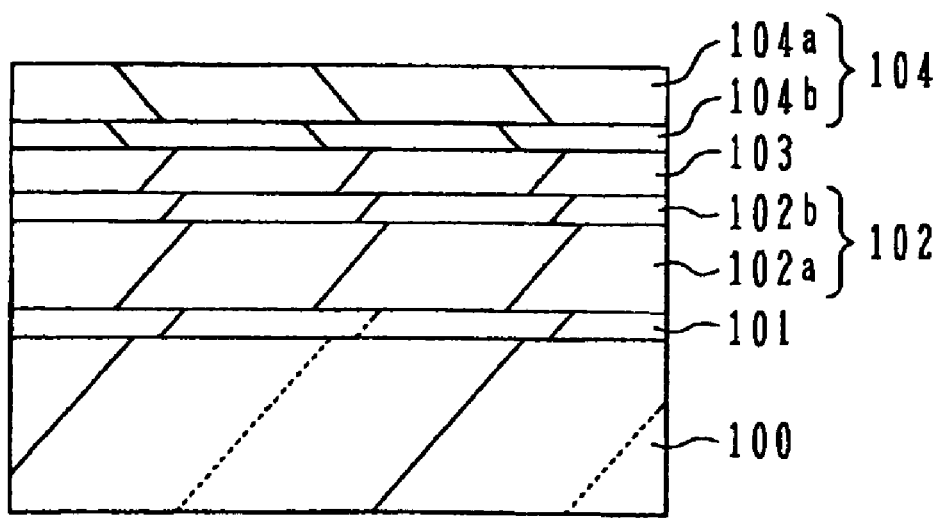
FIG. 19 is a schematic cross sectional view of a nitride semiconductor wafer.

The nitride semiconductor wafer described with reference to FIG. 19 is used as the material of the light emitting device of this embodiment. An optical emission region 150 is defined on the surface of a p-type nitride semiconductor layer 104, the optical emission region 150 having a square shape with a recess at one corner. The p-type nitride semiconductor layer 104, an optical emission layer 103 and a surface layer of an n-type nitride semiconductor layer 102, in an area surrounding the optical emission area 150, are removed to form a recess 111 (contour groove 111) exposing the n-type nitride semiconductor layer 102 on the bottom of the recess.

A p-side electrode 105 is formed on the optical emission region 150. The p-side electrode 105 is constituted of a lattice portion 105a and a p-side pad portion 105b. The lattice portion 105a has a lattice structure, and a shape of a section surrounded by each lattice of the lattice portion 105a is a square. The p-side pad portion 105b is formed at the corner adjacent to the recessed corner of the optical emission region 150, covering the lattice portion 105a. The p-side electrode 105 is in ohmic contact with the p-type nitride semiconductor layer 104.

A dent 106 is formed inside each lattice of the lattice portion 105a. However, the dent 106 is not formed inside each lattice of the lattice portion 105a in an area where the p-side pad portion 105b is formed.

Each dent 106 has a circular shape at the upper edge of an opening, and the bottom of the opening reaches the n-type nitride semiconductor layer 102. The sidewall of each dent 106 has a taper broadening the dent from a lower position toward a higher position.

An n-side electrode 107 is formed on the bottom of the contour groove 111. The n-side electrode 107 is constituted of a linear portion 107a and an n-side pad portion 107b. The n-side pad portion 107b is disposed in the recessed area of the optical emission region 150. The linear portion 107a is connected to the n-side pad portion 107b, and has a narrow elongated shape in a direction parallel to one side of the optical emission region 150. The n-side electrode 107 is in ohmic contact with the n-type nitride semiconductor layer 102.

As a predetermined voltage is applied between the p-side electrode 105 and n-side electrode 107, light is emitted from the optical emission layer 103. A wavelength of light emitted from the optical emission layer 103 is, for example, about 480 nm. The p-side electrode 105 may be made of material not transparent to light emitted from the optical emission layer 103. It is possible to output light from the upper surface of the light emitting device not formed with the p-side electrode 105, to the exterior of the device.

A protective film 110 made of, e.g., silicon oxide, covers the whole upper surface of the light emitting device excepting a partial upper surface of the p-side pad portion 105b and a partial upper surface of the n-side pad portion 107b. The protective film 110 is electrically insulative and substantially transparent to light emitted from the optical emission layer 103.

Next, with reference to FIGS. 2A to 2C and FIGS. 3A to 3C, description will be made on a manufacture method for the light emitting device of the first embodiment. The nitride semiconductor wafer described with reference to FIG. 19 is prepared.

Figure 2A:
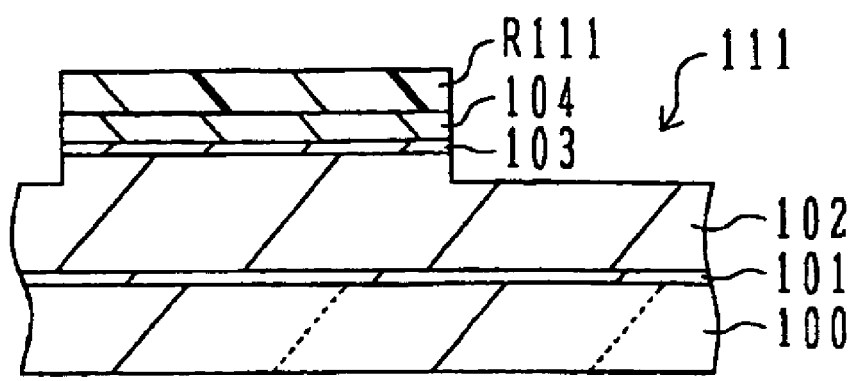
FIGS. 2A to 2C and FIGS. 3A to 3C are schematic cross sectional views illustrating a manufacture method for the light emitting device of the first embodiment.

First, as shown in FIG. 2A, a resist mask R111 is formed by photolithography, having an opening corresponding to the contour groove 111. Next, the p-type nitride semiconductor layer 104 and optical emission layer 103 and a surface layer of the n-type nitride semiconductor layer 102 in the opening of the resist mask R111 are removed by dry etching to form the contour groove 111 exposing the n-type nitride semiconductor layer 102 on the bottom of the contour groove. The resist mask R111 is thereafter washed and removed.

A depth of the contour groove 111 is, for example, 0.65 μm. A number of light emitting devices are formed on the nitride semiconductor wafer. The contour grooves 111 define the borders of light emitting devices formed on the nitride semiconductor wafer.

Figure 2B:
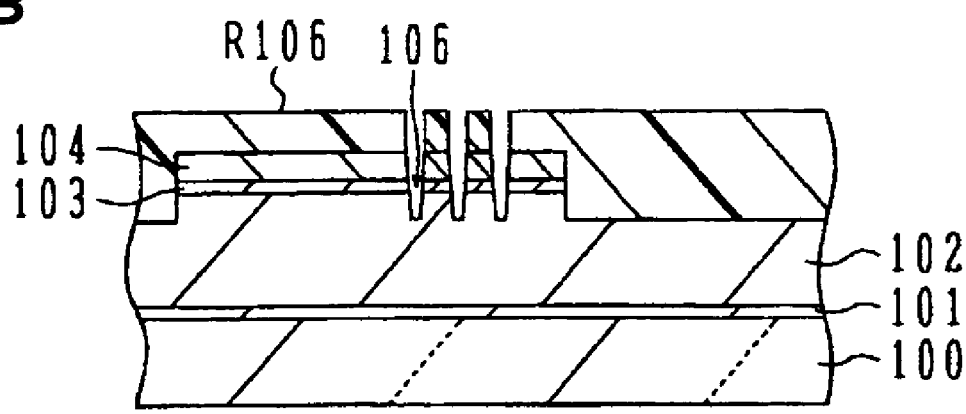

Next, as shown in FIG. 2B, a resist mask R106 is formed by photolithography, having openings corresponding to dents 106. Next, the p-type nitride semiconductor layer 104 and optical emission layer 103 and a surface layer of the n-type nitride semiconductor layer 102 in the openings of the resist mask R106 are removed by dry etching to form dents 106 exposing the n-type nitride semiconductor layer 102 on the bottoms of the dents. For example, dry etching may be reactive ion etching (RIE) using a chlorine plasma gas. After the dry etching, the resist mask R106 is washed and removed.

The sidewall of each opening of the resist mask R106 is tapered to broaden the opening from a lower position toward a higher position, and the dry etching is performed so that each dent 106 has a taper shape reflecting the taper shape of each opening of the resist mask R106. An inclination angle of the taper of the dent 106 can be adjusted by changing a selection ratio between the resist mask R106 and the nitride semiconductor layers. A selection ratio between the resist mask R106 and the nitride semiconductor layers can be changed depending upon the pressure condition, gas type, RF power and the like of the dry etching.

Resist residues, crystal residues and the like may be attached to the surface of the dent 106 formed by dry etching. To remove them, the nitride semiconductor wafer after the dry etching is wet etched by an aqueous solution of sulfuric acid and hydrogen peroxide or (and) an aqueous solution of hydrochloric acid and hydrogen peroxide. Decomposed organic residues of the resist and crystal residues can therefore be removed from the surface of each dent 106.

With this dry etching of forming the dents 106, a disturbed crystal lattice layer and/or a damage layer that is damaged by gas atoms or molecules used by the dry etching and is invaded into crystals may be formed on the inner wall surfaces of the dents 106. This may cause a lowered reliability of the light emitting device. In addition to the above-described wet etching, an additional wet etching for removing the surface layer of the inner wall of each dent 106 may be performed so that the reliability of the light emitting device can be improved. This wet etching can be performed for 3 to 30 minutes at a room temperature to 120° C. (e.g., 100° C.) by using as an etchant phosphoric acid, sulfuric acid, or mixture liquid of phosphoric acid and sulfuric acid, for example.

Figure 2C:
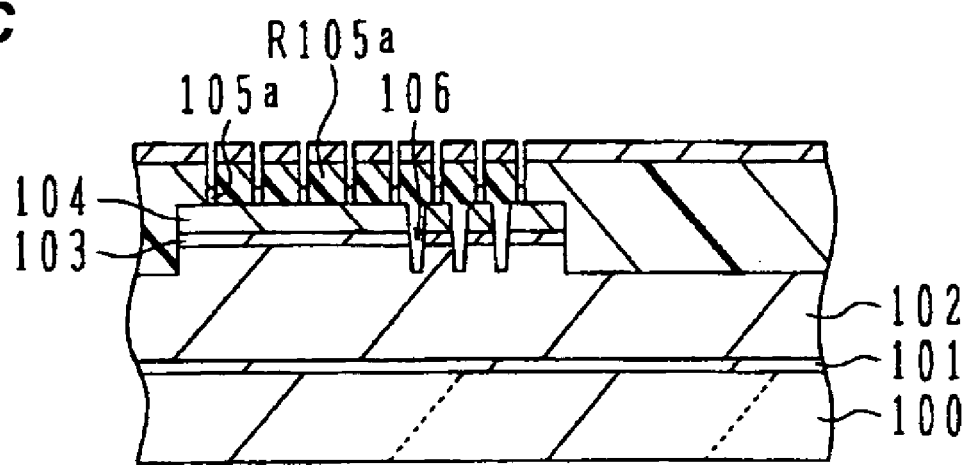

Next, as shown in FIG. 2C, a resist mask R105a is formed by photolithography, having openings corresponding to the lattice portion 105a of the p-side electrode 105. A Pt layer and an Au layer are deposited sequentially by using the Pt layer as a lower layer, to thicknesses of about 100 nm and about 1000 nm, respectively by electron beam (EB) vapor deposition. The vapor deposition material deposited on the surface other than the openings is removed to leave the lattice portion 105a.

Figure 3A:
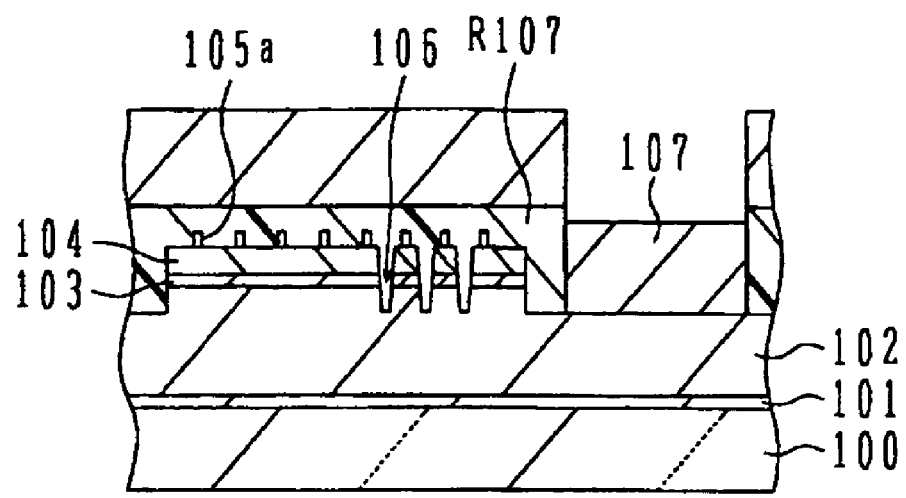

Next, as shown in FIG. 3A, a resist mask R107 is formed by photolithography, having an opening corresponding to the linear portion 107a and n-side pad portion 107b of the n-side electrode 107.

Al, Rh, Ti, Pt, Au, Pt and Au layers are sequentially deposited by using the Al layer as the bottom layer, to thicknesses of about 10 to about 90 nm, about 100 nm, about 100 nm, about 100 nm, about 200 nm, about 100 nm and about 200 nm, respectively, by EB vapor deposition. The vapor deposition materials deposited on the surface other than the opening of the resist mask R107 are removed by lift-off to form the linear portion 107a and n-side pad portion 107b of the n-side electrode 107 at the same time. The n-side electrode 107 is formed in this manner.

Figure 3B:
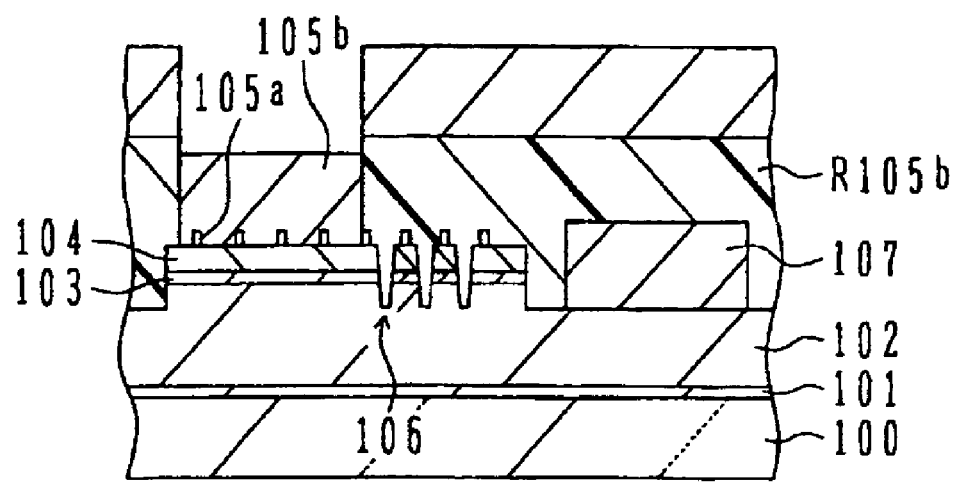

Next, as shown in FIG. 3B, a resist mask R105b is formed by photolithography, having an opening corresponding to the p-side pad portion 105b of the p-side electrode 105. A portion of the lattice portion 105a is exposed in the opening corresponding to the p-side pad portion 105b.

An Ni layer and an Au layer are deposited sequentially by using the Ni layer as a lower layer, to thicknesses of about 100 nm and about 1000 nm, respectively, by EB vapor deposition. Next, the vapor deposition materials deposited on the surface other than the opening of the resist mask R105 are removed by lift-off to form the p-side pad portion 105b. The p-side pad portion 105b is formed so as to be connected to the lattice portion 105a and to cover a portion of the lattice portion 105a.

Figure 3C:
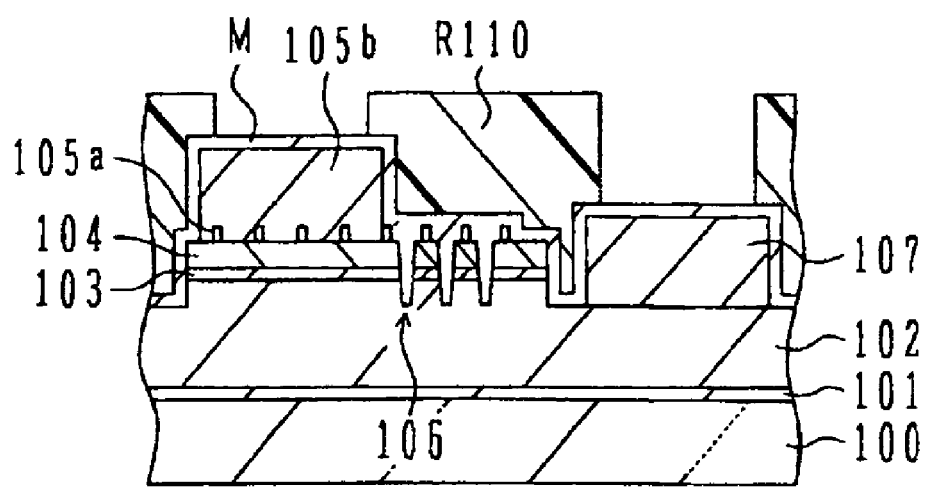

Next, as shown in FIG. 3C, a silicon oxide film ($SiO_2$ film) M having a thickness of about 100 nm to about 500 nm is formed on the whole upper surface of the light emitting device by sputtering.

For example, three layers of silicon oxide each having a thickness of about 100 nm are deposited to form the silicon oxide film M having a thickness of about 300 nm. A silicon oxide film deposited on the inner surface of the dent 106 is subject to complex stresses. If a film having a thickness of 300 nm is formed at a time, there arises a fear that the silicon oxide film may be peeled off from the dents 106 or cracks may be formed in the silicon oxide film during a cooling period after the film formation. Such stresses can be suppressed by forming multiple thin silicon oxide layers in forming the silicon oxide film M.

A resist mask R110 is formed on the silicon oxide film M by photolithography, having openings above the p-side pad portion 105b and n-side pad portion 107b. Next, the silicon oxide film M in the openings of the resist mask R110 is removed by wet etching to expose the upper surfaces of the p-side pad portion 105b and n-side pad portion 107b. Next, the resist mask R110 is washed and removed. In this manner, a protective film 110 made of silicon oxide film is formed.

After the protective film 110 is formed, the nitride semiconductor wafer is fixed to a support substrate (e.g., a ceramics substrate or a silicon substrate) by using wax or the like. The nitride semiconductor wafer fixed to the support substrate is abraded and polished to thin the wafer to a thickness of about 100 μm to about 200 μm. While the wafer is fixed to the support substrate, the polished surface is washed, and a metal layer is formed on the bottom surface of the substrate 100, for example, by depositing a Ti layer and an Al layer to thicknesses of about 3 nm and about 200 nm, respectively, by EB vapor deposition. This metal layer functions to reflect light emitted from the optical emission layer 103.

Next, scribe grooves are formed in the bottom surface of the substrate 100. After the scribe grooves are formed, a knife edge of a breaking system is pushed against the surface of the contour groove 111 to separate the wafer into individual light emitting devices. With the processes described above, the light emitting device shown in FIGS. 1A and 1B can be manufactured.

Each of the separated light emitting devices is mounted to a frame, a stem, a wiring substrate, a heat sink or the like. The mounting method may be adhesion using a silver paste or resin, solder welding, ultrasonic junction using bumps, thermocompression bonding using eutectic bonding material, or the like. Thereafter, lead electrodes corresponding to polarities are connected to the p-side pad portion 105b and n-side pad portion 107b by gold wires or the like. Lastly, resin sealing or packaging is performed to complete a light emitting diode (LED) lamp.

The dent 106 is disposed in the inside of each lattice of the lattice portion 105a. If the electrode material constituting the lattice portion 105a moves and reaches the optical emission layer 103 and n-type nitride semiconductor layer 102 exposed on the sidewall of the dent 106 by electromigration or electrochemical migration involving moisture, an electric short occurs.

According to the researches made by the present inventors, it has been found that the migration can be suppressed if at least one of Pt, Pd, Ir and Rh is used as the material of the lattice portion 105a. If these electrode materials are used, a good contact resistivity (e.g., $5\times10^{-3}$ $\Omega$cm$^{-2}$ or lower) can be obtained.

In this embodiment, although the Pt layer is used as the layer (a layer under the Au layer) of the lattice portion 105a contacting the p-type nitride semiconductor layer 104, this layer may be a Pd layer, Rh layer or an Ir layer. By forming the Pt layer, Pd layer, Ir layer or Rh layer, the contact resistivity can be lowered and the reflectivity can be raised. The reflectivity referred to here is a reflectivity at an interface between the optical emission layer 103 and p-type nitride semiconductor layer 104, relative to the wavelength of light emitted from the optical emission layer 103.

In the LED lamp using the light emitting device of the embodiment, light reflected at the lower surface of the lattice portion 105a is reflected at the reflection layer formed on the bottom of the substrate 100 to allow the light to be output from the upper surface of the light emitting device. It is therefore preferable that the reflectivity at the lower surface of the lattice portion 105a is high.

As another constituent element, Ag may be used as the material of the lattice portion 105a. Ag is a metal having a higher reflectivity than those of Pt, Pd, Ir and Rh although Ag is likely to be subjected to electromigration and electrochemical migration. If Ag is used, Pt and Ag layers are sequentially laminated by using the Pt layer as a lower layer in such a manner that the layers have a width of about 60 to about 80% the design electrode width. Further, to cover this lamination, a layer of Pt, Pd, Ir or Rh is stacked to obtain the design electrode width. A layer of alloy containing Ag may be used in place of the Ag layer.

The Ti layer may be omitted from the n-side electrode 107 to form the lamination structure of Al, Rh, Pt, Au, Pt and Au layers. The Ti layer and one of the Pt layers may be omitted to form the lamination structure of Al, Rh, Au, Pt and Au layers. The remaining Pt layer and one of the Au layers may be further omitted to form the lamination structure of Al, Rh and Au layers. It is preferable to compensate for the thickness of the omitted layer or layers. For example, if the Ti layer is omitted, the thickness of the uppermost Au layer is preferably set to about 300 nm; if the Ti layer and one of the Pt layers are omitted, the thickness of the uppermost Au layer is preferably set to about 400 nm; and if the remaining Pt layer and one of the Au layers are further omitted, the thickness of the uppermost Au layer is preferably set to about 700 nm.

The p-side pad portion 105b may have a structure that Ni, Rh and Au layers are sequentially laminated by using the Ni layer as the lowest layer, a structure that Ti and Au layers are sequentially laminated by using the Ti layer as the lower layer, or a structure that Ti, Rh and Au layers are sequentially laminated by using the Ti layer as the lowest layer. Al, Sn or Pb may also be used as the metal material constituting the lowest layer of the p-side pad portion 105b.

The p-side electrode 105 and n-side electrode 107 formed by the above-described method have a low contact resistivity without resorting to alloying. The contact resistivity of the p-side electrode 105 is about $1\times10^{-3}$ $\Omega$cm$^2$ to $5\times10^{-3}$ $\Omega$cm$^2$, and the contact resistivity of the n-side electrode 107 is about $5\times10^{-6}$ $\Omega$cm$^2$ to $3\times10^{-5}$ $\Omega$cm$^2$. Since alloying is not performed, diffusion of the electrode material, which is frequently associated with alloying, will not occur. It is therefore possible to suppress transfer of the electrode material to the sidewall of the dent 106. Even with alloying process, if processing temperature is below 500° C., diffusion of the electrode material is unlikely to occur.

If the p-side electrode 105 or n-side electrode 107 is formed before the dents 106 are formed, the electrode material is likely to be attached to the sidewalls of the dents 106 during dry etching of forming the dents 106 or during the subsequent wet etchings. Further, if the electrode material has already been formed on the semiconductor surface, strong acid, strong alkali or strong oxidizing liquid cannot be used as etchant in the processing of cleaning the dents 106. Therefore, decomposed organic residues of resist and crystal residues cannot be removed sufficiently from the dents 106, which may cause defects. In the method described above, these defects can readily be avoided because the p-side electrode 105 and n-side electrode 107 are formed after the dents 106 are formed and cleaned. Thus, this order of the steps is preferable.

In addition to silicon oxide, other materials can be used to form the protective film 110 as long as they are sufficiently transparent to the emission wavelength of the light emitting device and are electrically insulative. Such materials include, but not limited to, titanium oxide ($TiO_2$, $TiO_3$ $Ti_2O_5$), aluminum oxide ($Al_2O_3$), zirconium oxide ($ZrO_2$), hafnium oxide ($HfO_2$), neodymium oxide ($Nd_2O_3$), erbium oxide ($Er_2O_3$) and cerium oxide ($Ce_2O_3$).

The protective film 110 suppresses an electric short that may be caused by attachment of contaminating substances to the sidewall of the dent 106. The contaminating substance may be moisture, conductive material (polymerization residues and polymerization catalysts having alkene group or alkyne group) contained in resin for sealing the light emitting device, or the like.

If the protective film 110 is peeled off for some reasons, an electric short may occur because moisture or the like permeates under the protective film 110 and reaches the dent sidewall. The following are possible causes of such undesirable peeling. The protective film 110 may be peeled off at the pad portion because of the heat and ultrasonic vibrations generated when the p-side pad portion 105b and n-side pad portion 107b are respectively subject to wire-bonding. There is also a possibility that the protective film 110 is peeled off near the lattice portion 105a of the p-side electrode because of the heat generated during optical emission of the LED lamp.

Figure 23:
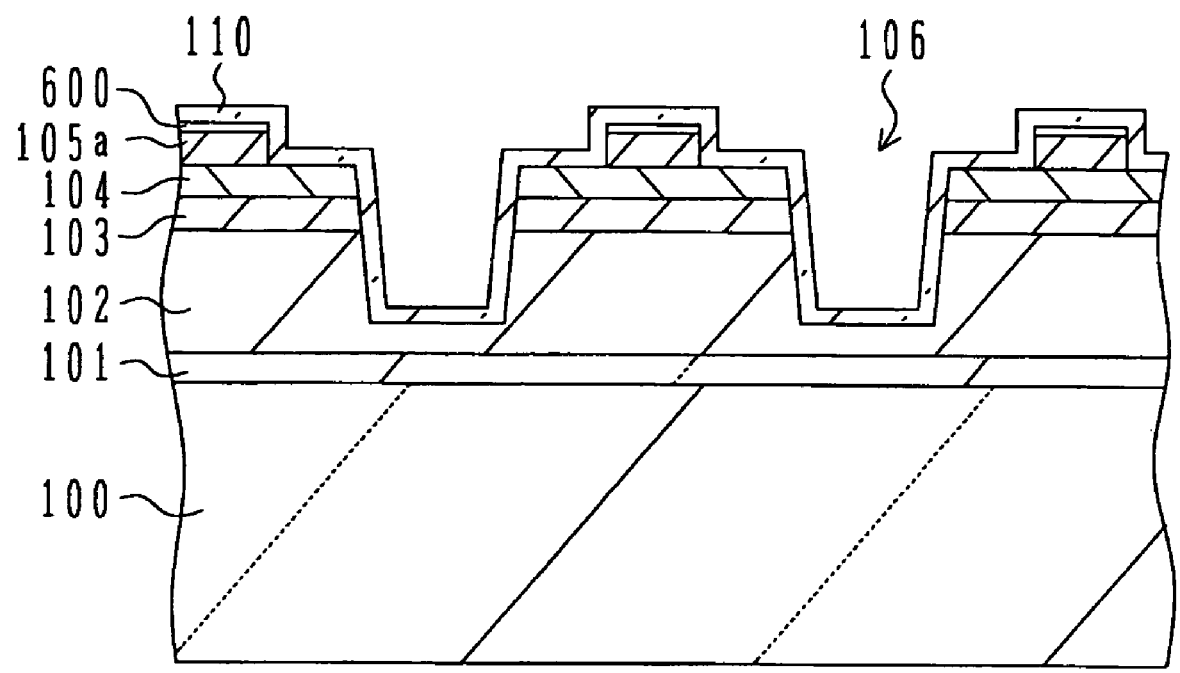
FIG. 23 is a schematic cross sectional view showing a Ti layer formed on the surface of an electrode.

To obviate these potential problems, attachment between the p- and n-side electrodes and protective film 110 can be enhanced by optionally vapor-depositing a Ti layer having a thickness of, e.g., about 3 nm to about 100 nm (more preferably about 30 nm to about 50 nm) on the uppermost surfaces of the lattice portion 105a, p-side pad portion 105b, linear portion 107a of the n-side electrode, and n-side pad portion 107b, before the protective film 110 is formed. FIG. 23 shows a Ti layer 600 formed on the surface of the lattice portion 105a. When the lattice portion 105a and protective film 110 are tightly attached in this way, the inside of each lattice (each section) of the lattice portion 105a is hermetically sealed so that moisture and the like cannot permeate to the sidewall of the dent in the lattice. Thus, it is possible to suppress contaminating substances from diffusing to the lower surface of the protective film 110. It is also possible to suppress formation of cracks and the like. Accordingly, the formation of this additional Ti layer is a preferred option.

During wet etching of forming openings through the protective film 110 above the p-side pad portion 105b and n-side pad portion 107b, the Ti layer is etched so that the Au layer is exposed on the bottoms of the openings of the protective film 110. Although the Ti layer is vapor-deposited by way of example, other metals (e.g., Al and Ni) that are easily oxidized may be used to enhance the attachment.

Additionally, if desired, a ring-shaped metal dam having a Ti, Al or Ni layer as the uppermost layer may be formed along the outer periphery of the contour groove 111 before the protective film 110 is formed. In this case, the protective film 110 can be formed in tight attachment to the ring-shaped metal dam. It is therefore possible to suppress invasion of contaminating substances from the interface between the ring-shaped metal dam and protective film 110.

Figure 4A:
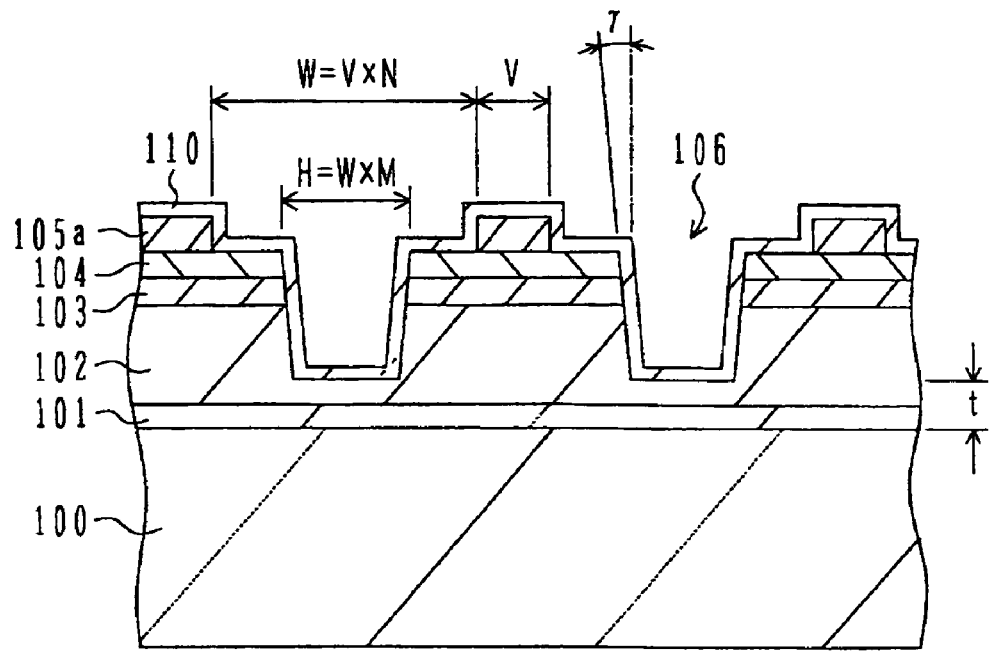
FIG. 4A is a schematic cross sectional view showing a region near dents.
Figure 4B:
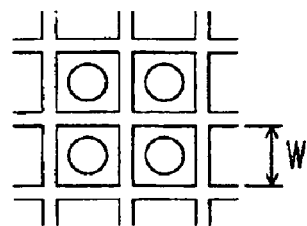
FIGS. 4B and 4C are schematic plan views showing regions near dents.

Next, with reference to FIGS. 4A and 4B, description will be made on the size and the shape of the dent 106. FIG. 4A is a schematic cross sectional view of the region near dents 106, and FIG. 4B is a schematic plan view of the region near the dents 106. As shown in FIG. 4A, the protective film 110 covers the upper surface of the p-type nitride semiconductor layer 104 and the lattice portion 105a, and also the sidewall and bottom of the dent 106.

For example, the dimensions may be set such that a line width V of the lattice portion 105a is 3 μm, a distance between the centers of a pair of opposite sides of each lattice is 15 μm, and a width W (hereinafter called a wiring distance W) of an area defined between a pair of opposite sides of each lattice is 12 μm.

The line width V of the lattice portion 105a is preferably set in a range from about 1 μm to about 5 μm. If the line width V is about 5 μm or narrower, the optical output efficiency at the upper surface of the light emitting device is less adversely affected by the light shielding effect of the lattice portion 105a. Further, the line width V is preferably about 1 μm or wider so that electric currents flow in a wide surface area of the p-type nitride semiconductor layer 104 and that a high productivity can be ensured.

By using the line width V as a unit, the wiring distance W is expressed by a formula of W=V×N, and N is called a wiring distance coefficient. A proper value of the wiring distance coefficient N changes with a specific resistance of the p-type nitride semiconductor layer 104. If the specific resistance of the p-type nitride semiconductor layer 104 is about 0.5 Ωcm to about 3 Ωcm, a proper wiring distance coefficient N is 3 to 5. If the specific resistance of the p-type nitride semiconductor layer 104 is $1 \times 10^{-3}$ Ωcm to $1 \times 10^{-1}$ Ωcm, a proper wiring distance coefficient N is about 5 to about 10.

Each dent 106 is disposed at the center of each lattice of the lattice portion 105a. A diameter of the upper edge of the opening of the dent 106 is, for example, about 1 μm or larger (e.g., 5.5 μm), and a depth of the dent 106 is, for example, about 2.36 μm.

The inclination angle γ of the sidewall of the dent 106 relative to the normal to the upper surface of the p-type nitride semiconductor layer 104 is, for example, about 8.1°. Also, the tapering of the dent 106 may not be needed for some applications. The inclination angle γ is preferably set in a range from 0° to about 12°. If the inclination angle of the taper is not uniform on the sidewall, the inclination angle is defined by using a fitting line of the whole taper.

A shortest distance from the lattice portion 105a to the upper edge of the opening of the dent 106 (distance from one side of the lattice to the upper edge of the opening) is preferably about 2 μm or longer from the viewpoint of suppression of migration of the wiring material into the dent 106 and improvement of the manufacture yield. The diameter H of the opening is expressed by a formula of H=W×M by using the wiring distance W as a unit. Then, M is called "dent width coefficient." The dent coefficient M is preferably set in a range from about 0.3 to about 0.7.

The ratio (hereinafter referred to as "aperture ratio") of the opening area of the dent to the inner area of one lattice of the lattice portion 105a (an area surrounded by the lattice portion 105a) is preferably in a range from about 7% to about 50%. The aperture ratio is more preferably in a range from about 10% to about 40%, and further more preferably in a range from about 12% to about 35%.

Figure 24A:
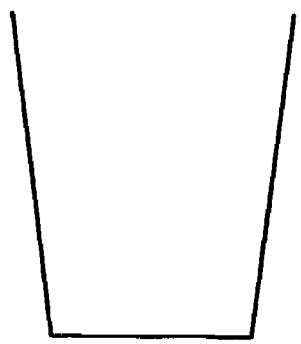
FIGS. 24A to 24C are schematic cross sectional views showing the shape of a bottom of each dent.
Figure 24B:
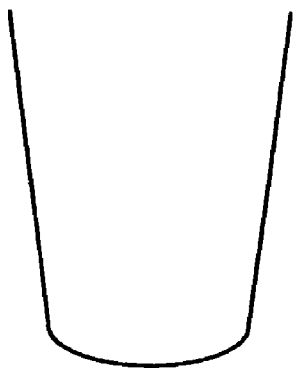
Figure 24C:
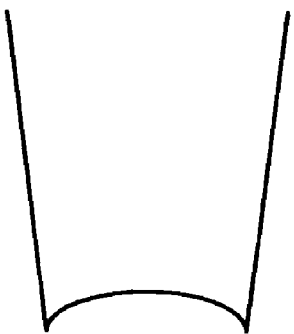

The depth of the dent is preferably about 0.3 to about 0.7 time the opening diameter H. The distance t from the bottom of the dent 106 to the substrate 100 is preferably about 1 μm or longer. However, the bottom of the dent 106 may reach the upper surface of the substrate 100. As shown in FIGS. 24A to 24C, the shape of the bottom of the dent may be one of a flat plane (FIG. 24A), a concave shape (FIG. 24B) or an upward convex shape (FIG. 24C). It is preferable to have a the convex shape. The depth of the dent 106 is defined as a distance down to the deepest point on the bottom face.

Figure 4C:
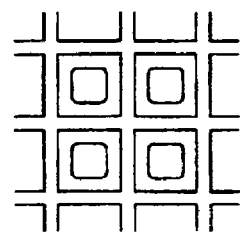

Further, the opening shape of the dent may take various shapes different from a circle. For example, as shown in FIG. 4C, the opening shape of the dent may be approximately rectangular.

Figure 20A:
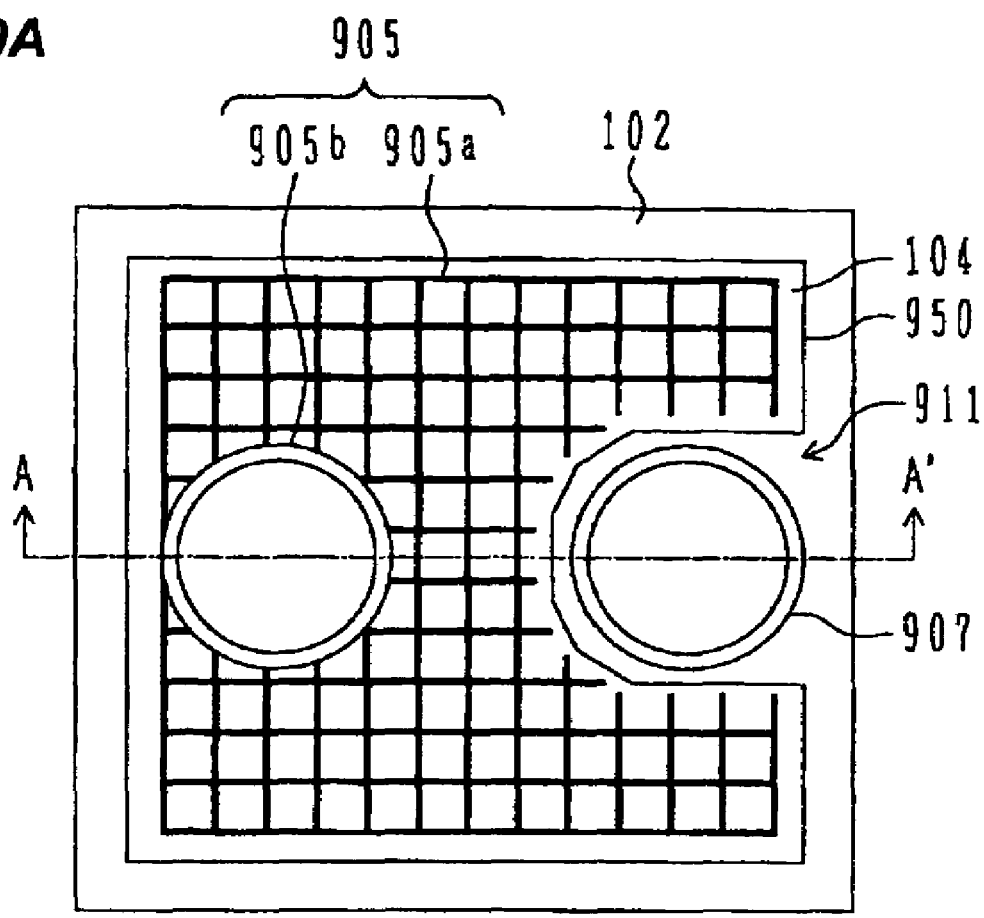
FIG. 20A is a schematic plan view of a light emitting device according to a comparative example.
Figure 20B:
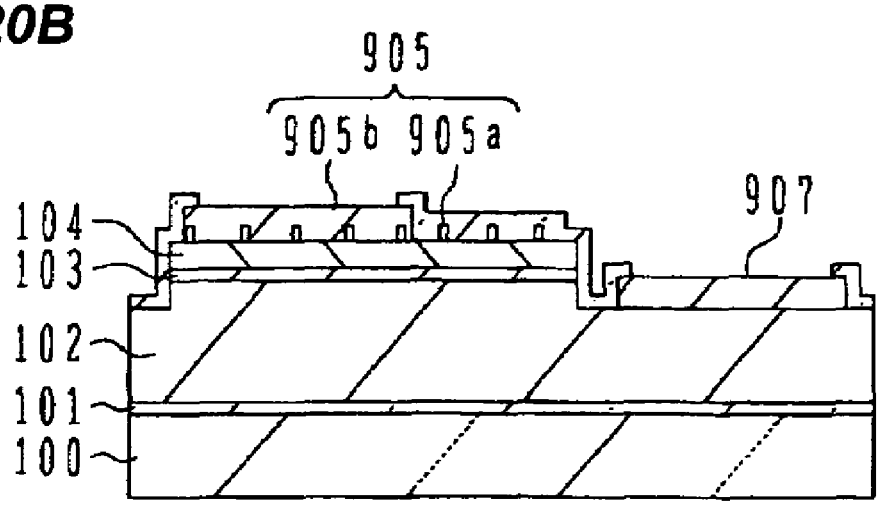
FIG. 20B is a schematic cross sectional view taken along the line A-A' shown in FIG. 20A.

Next, with reference to FIGS. 20A and 20B, the light emitting device of the comparative example will be described. This light emitting device is formed according to conventional techniques. FIG. 20A is a schematic plan view of the light emitting device according to the comparative example, and FIG. 20B is a schematic cross sectional view of the light emitting device of the comparative example taken along the line A-A' of FIG. 20A.

The light emitting device of the comparative example also uses as the starting material the nitride semiconductor wafer described with reference to FIG. 19. In the light emitting device of the comparative example, dents are not formed in the p-type nitride semiconductor layer 104. The shape of the optical emission region and the layout of the p- and n-side pad portions are different from those of the first embodiment. Detailed description will be made below.

In the light emitting device of the comparative example, the optical emission region 950 having a shape in which a central area of one side of a square layer is removed is defined on the surface of the p-type nitride semiconductor layer 104. By removing the p-type nitride semiconductor layer 104 and optical emission layer 103 and a surface layer of the n-type nitride semiconductor layer 102 in an area surrounding the optical emission area 950, a recess 911 (contour groove 911) is formed exposing the n-type nitride semiconductor layer 102 on the bottom of the recess.

The p-side electrode 905 is formed in the optical emission region 950. The p-side electrode 905 is constituted of the lattice portion 905a and p-side pad portion 905b. The lattice portion 905a has a lattice structure, and each lattice is square. The p-side pad portion 905b is formed in a central area of the side opposing the recessed side, covering the lattice portion 905a.

The n-side electrode 907 is formed on the bottom of the contour groove 911. The n-side electrode 907 only has an n-side pad portion and does not have a linear portion, in contrast to the n-side electrode 107 of the first embodiment.

The n-side pad portion of the comparative example is disposed in the recessed area of the optical emission region 950.

Next, description will be made on experiments of measuring emission outputs of the light emitting devices of the first embodiment and the comparative example. The light emitting devices of the first embodiment and the comparative example were mounted in a TO-46 stem, and the total light flux was measured by using an integrating sphere. The emission output of the light emitting device of the first embodiment was compared with that of the comparative example. The emission outputs measured in the unit of mW were compared.

An emission wavelength of the light emitting device of the first embodiment was 478 nm, and that of the comparative example was 480 nm. Regarding the emission output of the light emitting device of the comparative embodiment as 100%, the emission output of the light emitting device of the first embodiment was measured to be 140%. Thus, the light emitting device of the first embodiment exhibits a higher emission output than that of the comparative example. FIG. 16 collectively shows emission wavelengths and the emission outputs of light emitting devices of the first to sixth embodiments and comparative example.

Next, the operation and effects of the dent 106 formed in the light emitting device of the first embodiment will be described. First, problems associated with the light emitting device of the comparative example will be described.

Figure 21A:
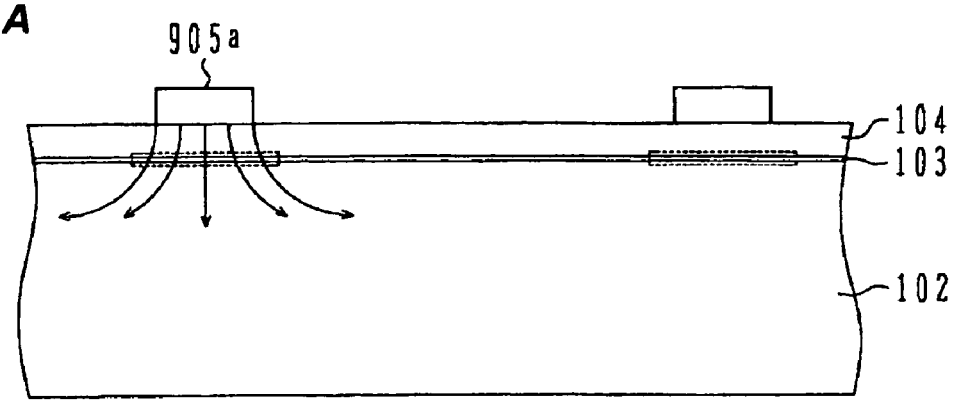
FIG. 21A is a schematic cross sectional view showing the region near a lattice portion of a p-side electrode of the light emitting device of the comparative example.

FIG. 21A is a schematic cross sectional view of a region near the lattice portion 905a of the p-side electrode of the light emitting device of the comparative example. Generally, since the specific resistance of the p-type nitride semiconductor layer 104 is high (e.g., $1 \times 10^{-2}$ Ωcm to 3 Ωcm), the p-type nitride semiconductor layer 104 is formed thin (e.g., about 1 µm or thinner) in order to suppress a serial resistance. Therefore, as indicated by arrows in FIG. 21A, current originating from the p-side electrode 905a flows into the n-type nitride semiconductor layer 102, without being diffused sufficiently into the p-type nitride semiconductor layer 104.

As a result, the region of the optical emission layer 103 contributing to optical emission is limited only to the region just under the lattice portion 905a and its nearby region (these regions are hereinafter referred to as "optical emission portion"). In FIG. 21A, the optical emission portion is indicated by a broken line. The region of the optical emission layer 103 other than the optical emission portion is considered to operate as an absorption layer for absorbing light emitted from the optical emission portion.

Figure 21B:
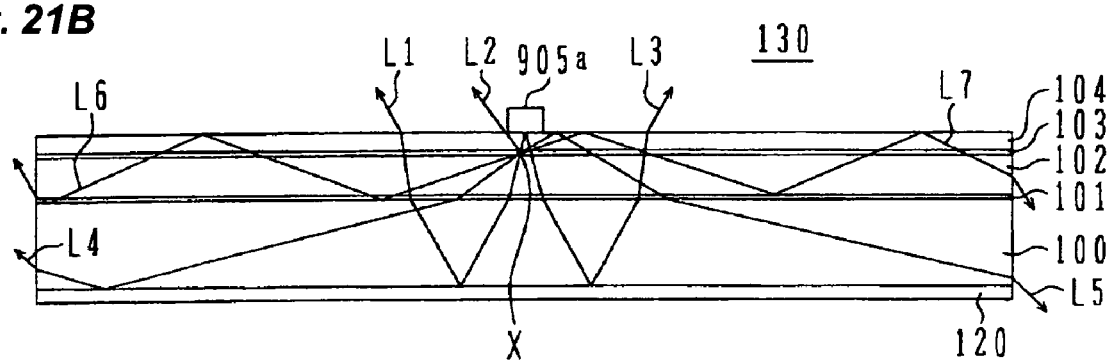
FIG. 21B is a schematic cross sectional view showing optical paths of light emitted from an optical emission portion and output to an exterior of the light emitting device of the comparative example used in an LED lamp.
Figure 22:
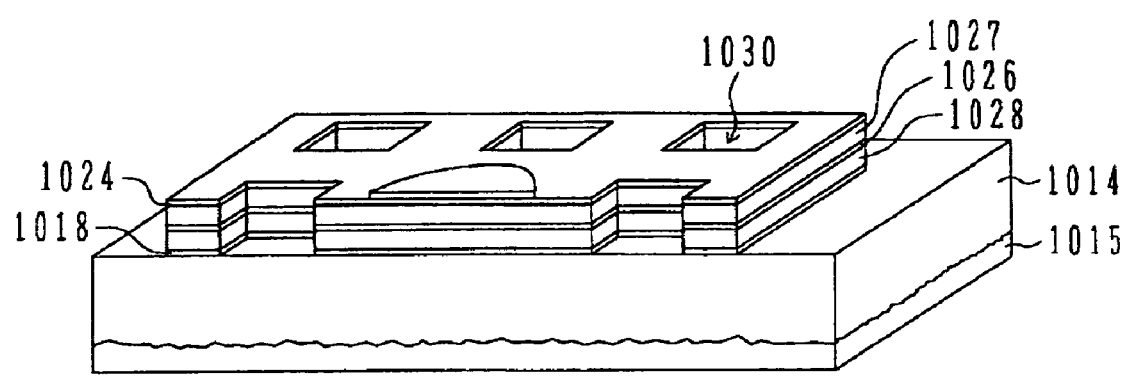
FIG. 22 is a perspective view of a light emitting device disclosed in U.S. Pat. No. 6,885,034.

FIG. 21B is a schematic cross sectional view showing optical paths of light that is emitted from an optical emission portion X and is output to an exterior of the light emitting device of the comparative example of an LED lamp. The optical paths shown are only illustrative examples.

A reflection layer 120 for reflecting light emitted from the optical emission layer 103 is formed on the bottom of the substrate 100. The light emitting device is sealed in translucent resin 130. Light emitted from the optical emission portion X is output to an exterior (into the translucent resin 130) of the device via various optical paths. The index of refraction of the nitride semiconductor layer is higher than that of the translucent resin 130 and that of the substrate 100.

Optical paths from the optical emission portion X to the exterior of the device may be classified into the following three types. The optical path of the first type is an optical path along which light is output to the exterior of the device from the upper surface of the nitride semiconductor layer (optical paths L1, L2 and L3 shown in FIG. 21B).

The optical path of the second type is an optical path of, among the light that is eventually output to the exterior of the device from the end face of the light emitting device, light not totally reflected at the interface between the nitride semiconductor layer and substrate 100 (optical paths L4, and L5 shown in FIG. 21B). Namely, light in the optical path of the second type laterally propagates within a region defined between the translucent resin 130 and the reflection layer 120 and is output from the end face of the light emitting device without being subject to total reflection at the interface between the nitride semiconductor layer and the substrate 100. Light propagating along such an optical path is hereinafter referred to as "intra-device propagating light." In the example shown in FIG. 21B, since the length of the light emitting device is short along the in-plane direction of the nitride semiconductor layer, the light propagating along the optical path L4 is reflected at the reflection layer 120 and is output from the device end face before the light is reflected at the interface between the nitride semiconductor layer and the resin 130 that is outside of the device. The light propagating along the optical path L5 is reflected at the interface between the nitride semiconductor layer and translucent resin 130 and thereafter is output from the device end face before the light is reflected at the reflection layer 120.

The optical path of the third type is an optical path of, among the light that is output to the exterior of the device from the end face of the light emitting device, light that is totally reflected also at the interface of the nitride semiconductor layer and substrate 100 (optical paths L6, and L7 shown in FIG. 21B). Namely, light in the optical path of the third type laterally propagates between the nitride semiconductor layer and substrate 100 and is output from the end face of the nitride semiconductor layer. Light propagating along such an optical path is hereinafter referred to as "intra-nitride semiconductor layer propagating light."

Light emitted from the optical emission layer 103 and propagating along any of the optical paths of three types is attenuated by absorption by a region of the optical emission layer 103 that is not contributing to optical emission and by absorption caused by defects in the nitride semiconductor layer and the like.

Since the nitride semiconductor layer is thin as compared to the total thickness of the light emitting device, it can be considered that the intra-nitride semiconductor layer propagating light goes through a larger number of reflections until the light reaches the end face of the device than that of that of the intra-device propagating light. For this reason, it can be considered that the intra-nitride semiconductor layer propagating light is likely to be attenuated more than the intra-device propagating light.

Figure 5:
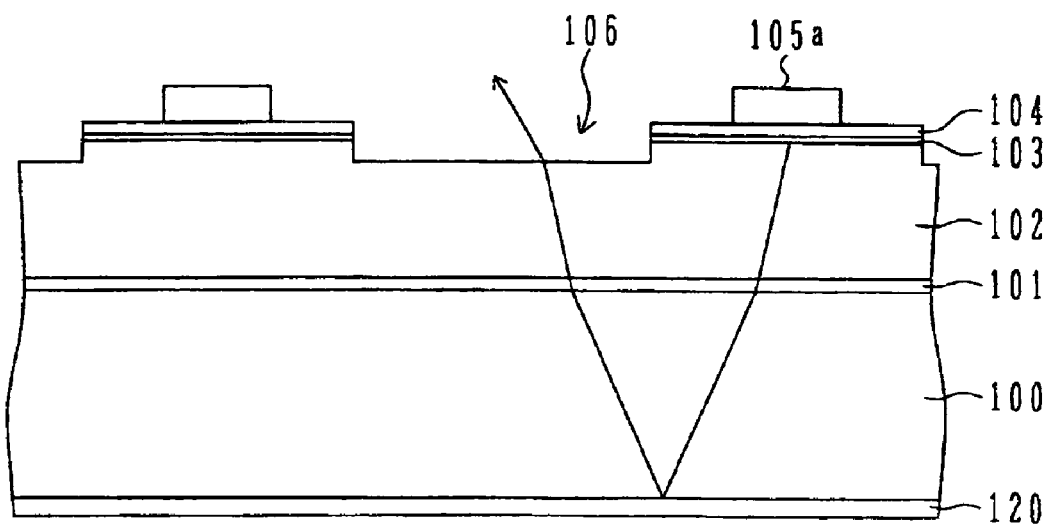
FIG. 5 is a schematic cross sectional view showing an optical path of light output from a bottom of a dent to an exterior of the light emitting device of the first embodiment.

FIG. 5 is a schematic cross sectional view showing an optical path of light output from a bottom of a dent to an exterior of the light emitting device of the first embodiment. The optical path shown is an illustrative example. In the light emitting device of the first embodiment, the dent 106 is formed in the p-type nitride semiconductor layer 104 where the lattice portion 105a is not formed. Namely, the dent is formed so as to remove a portion of the optical emission layer 103 that is not located adjacent to the lattice portion 105a and therefore does not contribute to optical emission.

For example, light output from the bottom of the dent 106 does not pass through the portions of the n-type nitride semiconductor layer 102, optical emission layer 103 and p-type nitride semiconductor layer 104 that have been removed in the formation of the dent 106. Therefore, the light emitting device of the first embodiment can output light through the bottom of the dents to the exterior of the device without suffering much attenuation by the nitride semiconductor layer, as compared with the case in which the dents are not formed.

Figure 6A:
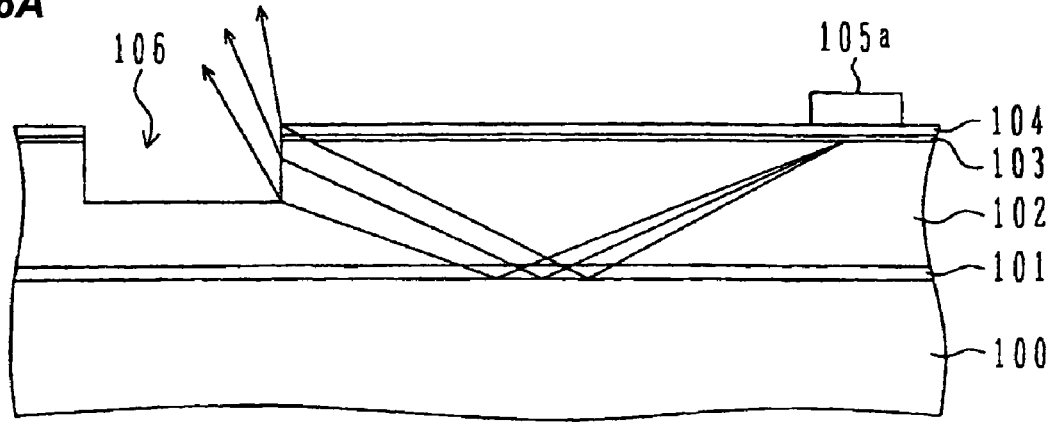
FIGS. 6A and 6B are schematic cross sectional views showing optical paths of light output from a sidewall of a dent to an exterior of the light emitting device of the first embodiment.

FIG. 6A is a schematic cross sectional view showing optical paths of light output from a sidewall of the dent 106 to an exterior of the light emitting device of the first embodiment. Consider, for example, the intra-nitride semiconductor layer propagating light. As shown in FIG. 6A, the intra-nitride semiconductor layer propagating light can be output to an exterior of the device from the sidewall of the dent 106 before the light reaches the end face of the nitride semiconductor layer. In the light emitting device of the first embodiment, light that would have arrived at and have been output from the device end face had the dent 106 not been formed can be output from the sidewall of the dent 106. Thus, it is possible to output light to the device exterior without suffering much attenuation that would have occurred had the light reached the end face of the light emitting device.

In FIG. 6A, since the light is refracted at the sidewall of the dent 106 and changes its optical path upward, it is possible to increase an amount of light emitted toward the upper surface side from the light emitting device (an amount of light along a directly substantially normal to the upper surface of the p-type nitride semiconductor layer 104).

Figure 6B:
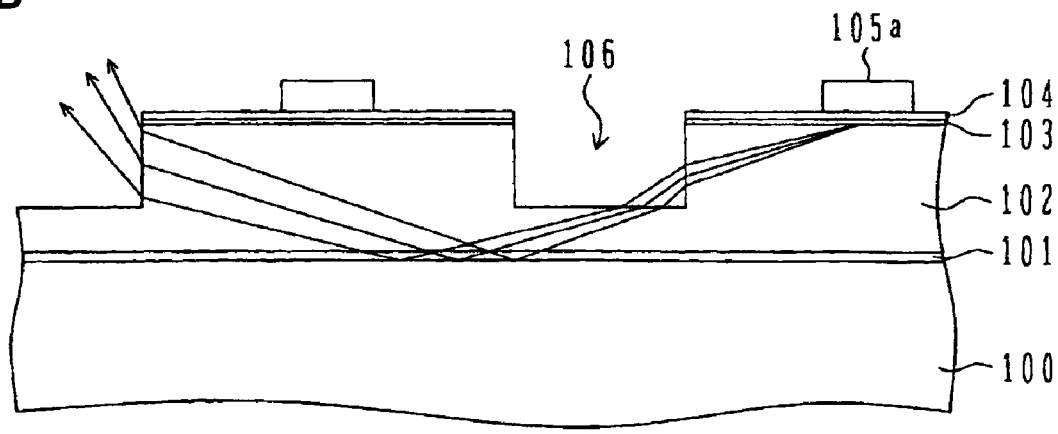

As shown in FIG. 6B, it is possible to have other optical paths along which light is output from the sidewall of one dent 106 to the device exterior, again enters the inside of the device, and thereafter is output from the sidewall of an adjacent dent 106 to the device exterior. Optical paths shown in FIGS. 6A and 6B are illustrative examples.

Figure 7A:
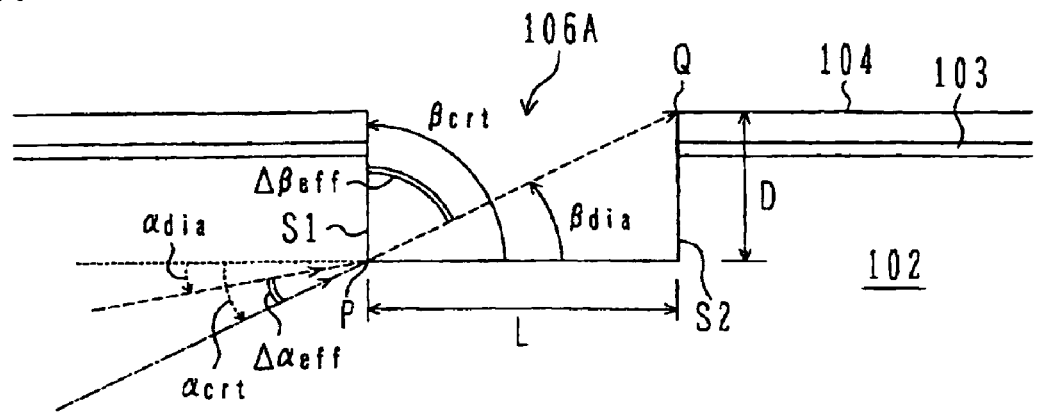
FIG. 7A is a schematic cross sectional view showing a region near a dent without a taper.
Figure 7B:
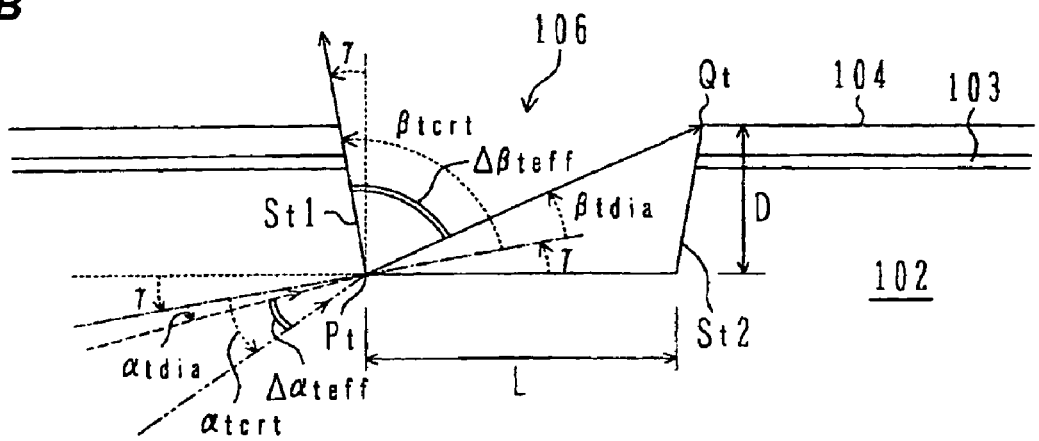
FIG. 7B is a schematic cross sectional view showing a region near a dent with a taper.

Next, with reference to FIGS. 7A and 7B, the operation and effects of a taper on the sidewall of a dent 106 will be studied.

FIG. 7A is a schematic diagram showing the region near a dent without a taper (this dent is indicated as a dent 106A). The sidewall of the dent 106A is perpendicular to the upper surface of the p-type nitride semiconductor layer 104. In this example, the upper edge of an opening and the border of the bottom of the dent 106A are respectively circular, and the shape of a space surrounded by the inner surface of the dent 106A is cylindrical. The cross section shown in FIG. 7A passes through the center of the upper edge circle of the dent 106A and is perpendicular to the upper surface of the p-type nitride semiconductor layer 104. A cross line between this cross section and the sidewall of the dent 106A is referred to as "side plane".

A diameter of the dent 106A is L and a depth thereof is D. The refractive index of the nitride semiconductor layer is n1 and the refractive index of a medium outside the device is n2. The refractive index n2 is smaller than n1. Consider now light propagating in the n-type nitride semiconductor layer 102 and being incident upon an incidence point P located at the lowest position of one side plane S1.

The incidence angle of light incident upon the incidence point P is defined by the angle between the light and the normal to the side plane S1. The refraction angle of light which becomes incident upon the incidence point P and is output to the dent 106A side is defined by the angle formed between the output light and the normal to the side plane S1.

The refraction angle of light output from the incidence point P to a point Q on the upper edge of the opening of the other side plane S2 is represented by $\beta$dia. The incidence angle of incident light corresponding to light output at the refraction angle $\beta$dia is represented by $\alpha$dia. The critical angle of total reflection at the incidence point P is represented by $\alpha$crt. The refraction angle of output light corresponding to incident light at the critical angle $\alpha$crt is represented by $\beta$crt. The refraction angle $\beta$crt is by definition 90°.

A refraction angle range of light that is incident upon the incidence point P, is output to the dent 106A side and thereafter is output to the exterior of the device is from $\beta$dia to $\beta$crt. The corresponding incidence angle range of the light that is incident upon the incidence point P, is output to the dent 106A side and is output to the exterior of the device is from $\alpha$dia to $\alpha$crt. The difference between the refraction angles $\beta$crt and $\beta$dia is defined as an output effective angle amount $\Delta\beta$eff, and the difference between the incidence angles $\alpha$crt and $\alpha$dia is defined as an input effective angle amount $\Delta\alpha$eff The Snell's law is satisfied for light having an incidence angle of $\alpha$ and a refraction angle of $\beta$:

$$n1 \sin \alpha = n2 \sin \beta \qquad (1)$$

According to the Snell's law (1), the incidence angles $\alpha$crt and $\alpha$dia can be calculated from the formulas (2) and (3):

$$\alpha crt = \sin^{-1}\left(\frac{n2}{n1}\sin\beta crt\right) \qquad (2)$$

$$\alpha dia = \sin^{-1}\left(\frac{n2}{n1}\sin\beta dia\right) \qquad (3)$$

$\beta$crt in the formula (2) is 90°. $\beta$dia in the formula (3) can be calculated from the formula (4):

$$\beta dia = \tan^{-1} d \qquad (4)$$

wherein d is a ratio D/L of the depth D to the diameter L of the dent.

For example, assuming that the ratio d be 0.5, the refractive index n1 of the nitride semiconductor layer be 2.4 and the refractive index n2 of the medium outside the device be 1.0, $\alpha$crt is 24.6° and $\alpha$dia is 10.7° from the formulas (2) and (3). Using these angles, the input effective angle amount $\Delta\alpha$eff is 13.9°.

If the refractive index n2 of the medium outside the device is 1.5 under the same conditions, then $\alpha$dia is 16.2° and $\alpha$crt is 38.7°. Using these angles, the input effective angle amount $\Delta\alpha$eff is 22.5°. It can be understood that the input effective angle amount becomes large as the refractive index of the medium outside the device becomes large.

FIG. 7B is a schematic diagram showing the region near a dent with a taper. The dent 106 has a shape broadening from the bottom toward the top. In this example, the upper edge of an opening and the border of the bottom of the dent 106 are respectively circular, and the shape of a space surrounded by the inner surface of the dent 106 is a truncated cone. The cross section shown in FIG. 7B passes through the center of the upper edge of the dent 106 and is perpendicular to the upper surface of the p-type nitride semiconductor layer 104. The inclination angle of the sidewall of the dent 106 is $\gamma$. A cross line between this cross section and the sidewall of the dent 106 is referred to as "side plane".

The diameter of the border of the bottom of the dent 106 is L and a depth thereof is D. Consider now light propagating in the n-type nitride semiconductor layer 102 and being incident upon an incidence point Pt located at the lowest position of one side plane St1.

The incidence angle of light incident upon the incidence point Pt is defined by the angle between the light and the normal to the side plane St1. The refraction angle of light which is incident upon the incidence point Pt and is output to the dent 106 side is defined by the angle formed between the output light and the normal to the side plane St1.

The refraction angle of light output from the incidence point Pt to a point Qt on the upper edge of the opening of the other side plane St2 is represented by βtdia. The incidence angle of incident light corresponding to light output at the refraction angle βtdia is represented by αtdia. The critical angle of total reflection at the incidence point Pt is represented by αtcrt. The refraction angle of output light corresponding to incident light at the critical angle αtcrt is represented by βtcrt. The refraction angle βtcrt is by definition 90°.

The refraction angle range of light that is incident upon the incidence point Pt, is output to the dent 106 side and thereafter is output to the exterior of the device is from βtdia to βtcrt. The corresponding incidence angle range of the light which is incident upon the incidence point Pt, is output to the dent 106 side and is output to the exterior of the device is from αtdia to αtcrt. The difference between the refraction angles βtcrt and βtdia is defined as an output effective angle amount Δβteff, and the difference between the incidence angles αtcrt and αtdia is defined as an input effective angle amount Δαteff.

According to the Snell's law (1), the incidence angles αtcrt and αtdia can be calculated from the formulas (5) and (6):

$$\alpha tcrt = \sin^{-1}\left(\frac{n2}{n1}\sin\beta tcrt\right) \quad (5)$$

$$\alpha tdia = \sin^{-1}\left(\frac{n2}{n1}\sin\beta tdia\right) \quad (6)$$

where the refractive index of the nitride semiconductor layer is n1 and the refractive index of the medium outside the device is n2.

βtcrt in the formula (5) is 90°. βtdia in the formula (6) can be calculated from the formula (7):

$$\beta tdia = \tan^{-1}\left(\frac{d}{1+d\tan\gamma}\right) - \gamma \quad (7)$$

wherein d is the ratio D/L.

The taper inclination angle γ is, for example 8.0°. Assuming that the other conditions be the same: the ratio d be 0.5, the refractive index n1 of the nitride semiconductor layer be 2.4 and the refractive index n2 of the medium outside the device be 1.0, αtcrt is 24.6° from the formula (5). This angle coincides with αcrt described with reference to FIG. 7A above (due to the definition of the critical angle). αtdia is 7.0° from the formula (6). Using these angles, the input effective angle amount Δαteff is 17.6°.

Thus, the input effective angle amount Δαteff (17.6°) with the taper is larger than the input effective angle amount Δαeff (13.9°) without the taper. By forming the taper on the side plane of the dent, the input angle range to the side plane of the dent is broadened for the light which outputs from the dent side plane and outputs to the exterior of the device. Namely, the taper facilitates the output of light from the dent side plane.

Qualitatively, the taper broadens the upper portion of the dent more than the lower portion, and light output from the dent side plane is hard to enter the device from the upper portion of the dent side plane. It can therefore be said that more light tends to be output from the device. This explanation is also applicable to light output from the dent bottom.

Figure 8:
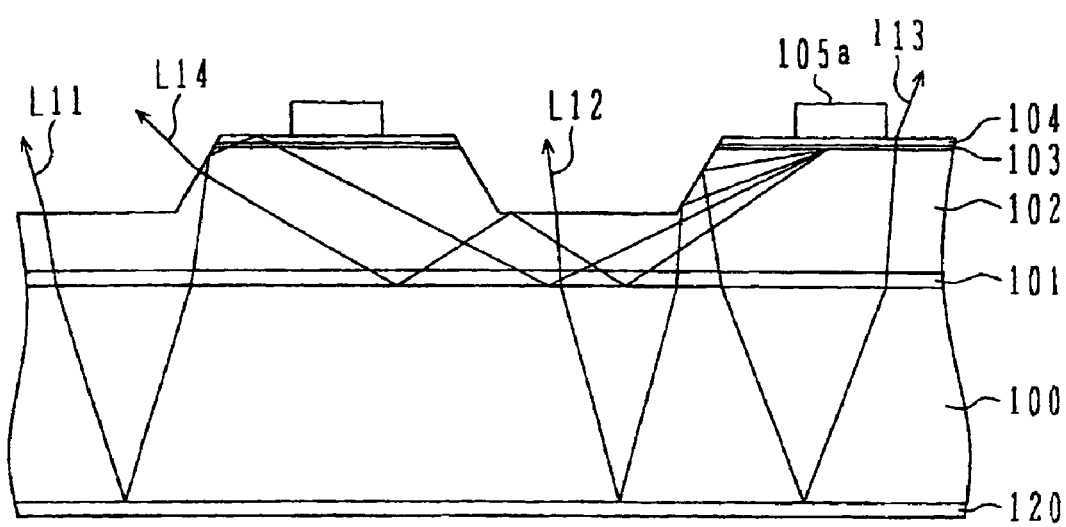
FIG. 8 is a schematic cross sectional view showing optical paths of light output from an inside of a dent with a taper to an exterior of the light emitting device.

As shown in FIG. 8, another effect can be expected. Light reflected at the tapered dent side plane (light indicated by optical paths L11 to L13 in FIG. 8) propagates in the lower region of the light emitting device, is reflected by the reflection layer 120, and is output to the exterior of the device from the upper surface of the p-type nitride semiconductor layer 104 and the bottom of the dent 106. Another effect can also be expected. Light output from the dent side plane to the exterior of the device (light indicated by an optical path L14 in FIG. 8) has an incidence angle upon the dent side plane that is made smaller by the taper, so that the reflection loss at the dent side plane can be reduced.

Next, effects on the intra-nitride semiconductor layer propagating light are described. Assuming that the refractive index of the nitride semiconductor layer be 2.4 and the refractive index of the substrate 100 made of sapphire be 1.77, the critical angle of light that progresses towards the substrate 100 from the nitride semiconductor side and that is totally reflected at the interface between the nitride semiconductor layer and substrate 100 is 47.5° from the Snell's law (1). Therefore, the intra-nitride semiconductor layer propagating light has an incidence angle of 47.5° or more with respect to the substrate 100.

Consider the case in which the dent side plane is perpendicular (without taper). The maximum incidence angle of the intra-nitride semiconductor layer propagating light incident upon the dent side plane is 42.5° which is the complementary angle of 47.5°.

If the incidence critical angle αcrt is over 42.5°, there does not exist the intra-nitride semiconductor layer propagating light incident upon the dent side plane at an incidence angle in the range from 42.5° to the incidence critical angle αcrt. Therefore, all such intra-nitride semiconductor layer propagating light is output to the exterior of the device because such light has the maximum incidence angle of 42.5 with respect to the dent side plane and this maximum angle is below αcrt.

In the example described with reference to FIG. 7A, the incidence critical angles αcrt are 24.6° and 38.7° at the refractive indices of 1.0 and 1.5 of the medium outside the device, respectively. Since these incidence critical angles αcrt are smaller than 42.5°, these angles are included in the angle range in which the intra-nitride semiconductor layer propagating light can be incident upon the dent side plane. Accordingly, in this case, not all the intra-nitride semiconductor layer propagating light is output to the exterior, and some undergoes total internal reflection.

Next, a dent with a taper on the dent side plane is analyzed. With the taper inclination angle being represented by γ, the maximum incidence angle of the intra-nitride semiconductor layer propagating light incident upon the dent side plane is 42.5°-γ where 42.5° is a complementary angle of 47.5°.

If 42.5°-γ is smaller than the incidence critical angle αcrt, there does not exist the intra-nitride semiconductor layer propagating light incident upon the dent side plane at an incidence angle in the range from 42.5°-γ to the incidence critical angle αcrt. Therefore, all such intra-nitride semiconductor layer propagating light is output to the exterior of the device because such light has the maximum incidence angle of 42.5°-γ with respect to the dent side plane and this maximum angle is below αcrt. The minimum inclination angle γ that allows all such intra-nitride semiconductor layer propagating light to be output to the exterior is the angle at which 42.5°-γ equals the incidence critical angle αcrt. Namely, this inclination angle γ can be calculated from the formula 42.5°-αcrt.

In the example described with reference to FIG. 7B, the incidence critical angles αcrt are 24.6° and 38.7° at the refractive indices of 1.0 and 1.5 of the medium outside the device, respectively. At the refractive index of 1.0 of the medium outside the device, the minimum inclination angle is 42.5°−24.6°=17.9°, whereas at the refractive index of 1.5 of the medium outside the device, the minimum inclination angle is 42.5°−38.7°=3.8°. Therefore, by appropriately setting the inclination angle of the side wall of the dent, it is possible to direct all or substantially all intra-nitride semiconductor layer propagating light rays that are incident upon the side wall of the dent towards the exterior without subjecting any portion of them to total internal reflection.

Although the preceding descriptions focus on the intra-nitride semiconductor layer propagating light, light emitted from the optical emission layer and output from the dent to the exterior of the device can take various other optical paths. Based on empirical studies performed by the present inventors, it has been found that it is generally preferable to set the taper inclination angle in the range of 0° to about 12°. Further, according to the above studies directed to the intra-nitride semiconductor layer propagating light, it has been found that the taper inclination angle can be made smaller as the refractive index of the medium outside the device is made larger.

If the refractive index of the medium outside the device is in a range from 1.0 to 1.3, the inclination angle of the dent taper is preferably about 3° to about 18° and more preferably about 5° to about 12°. If the refractive index of the medium outside the device is in a range from 1.3 to 1.6, the inclination angle of the dent taper is preferably 0° to about 12° and more preferably 0° to about 7°. If the refractive index of the medium outside the device is in a range from 1.6 to 2.0, the inclination angle of the dent taper is preferably 0° to about 7° and more preferably 0° to about 3°.

Studies were performed on the relation between the diameter of the opening and the depth of the dent. The ratio of the dent depth to the diameter of the opening of the dent is defined as the "dent depth ratio." As the dent depth ratio becomes larger, light output from the region near the bottom of the dent to the exterior of the device becomes more likely to enter again the device from the dent side plane. As the dent depth ratio becomes smaller, the area of the dent side plane becomes smaller and the optical output amount from the dent side plane reduces. According to empirical studies performed by the present inventors, the range of the dent depth ratio is preferably from about 0.3 to about 0.7 and more preferably from about 0.35 to about 0.55.

Next, description will be made on the distance from the dent bottom to the substrate 100. It is preferable that the distance from the dent bottom to the substrate 100 is about 1 μm or longer. With this setting, for example, it can be considered that light that is incident upon the interface between the nitride semiconductor layer and substrate 100 from the nitride semiconductor layer side and that is thereafter reflected upward can be output from the bottom of the dent 106 more easily.

The shape of the bottom of the dent may be either a flat plane, a concave shape or a upward convex shape, and is preferably the convex plane. If the convex shape is used, for example, light that is incident upon the interface between the nitride semiconductor layer and substrate 100 from the nitride semiconductor layer side and is reflected has an incidence angle to the dent bottom smaller than when the dent bottom is the flat plane. Improvement on the optical output efficiency can therefore be expected.

Figure 9A:
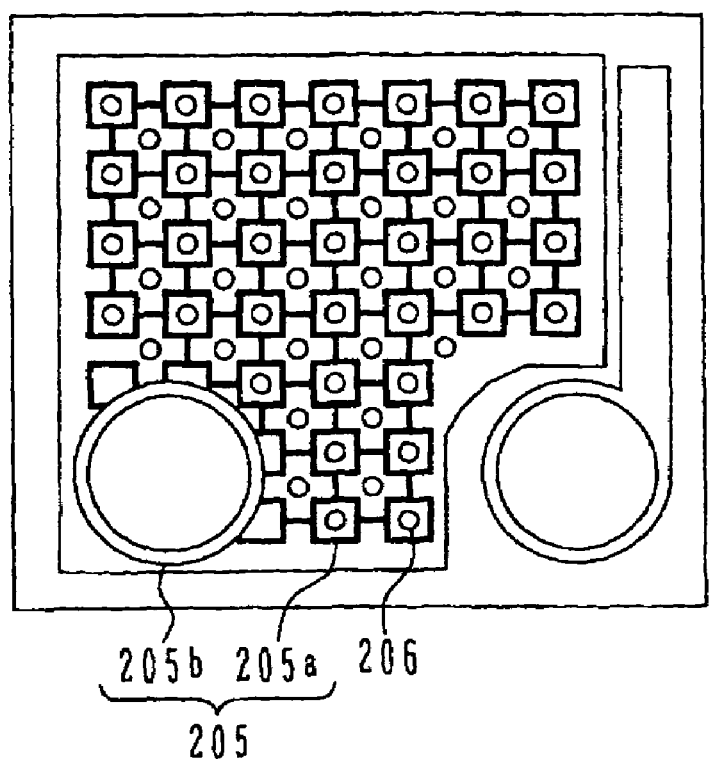
FIG. 9A is a schematic plan view of a light emitting device according to a second embodiment.

Next, with reference to FIG. 9A, description will be made on a light emitting device according to a second embodiment. FIG. 9A is a schematic cross sectional view of the light emitting device of the second embodiment. The shape of the lattice portion of the p-side electrode is different from that of the first embodiment, and the layout of dents is different correspondingly. The other structures are similar to those of the first embodiment.

The p-side electrode 205 is constituted of a lattice portion 205*a* and a pad portion 205*b*. The lattice portion 205*a* is constituted of a plurality of square peripheral parts (each part is called a square part) disposed in a matrix shape and linear parts (each part is called a coupling part) coupling adjacent square parts in a row or column direction of the matrix. Each side of the square part is parallel to the row or column direction. The coupling part couples the centers of a pair of opposing sides of adjacent square parts.

Consider now four square parts disposed at four apexes of one block of the matrix. These four square parts are coupled by coupling parts to define a crossed section (a dodecagon) surrounded by the four square parts and coupling parts.

A single dent 206 is formed in each square part, and a single dent 206 is formed in each crossed section. The dent 206 in each square part is disposed on an extension line of each coupling part connected to the corresponding square part.

The line width of the square part is, for example, about 3 μm. The length of the side of the square part (a distance between the centers of a pair of opposing sides of the square part) is, for example, about 15 μm. The layout distance between square parts (a distance between the centers of adjacent square parts) is, for example, 26.6 μm. The line width of the coupling part is, for example, about 3 μm.

The manufacture method for the light emitting device of the second embodiment is similar to that for the light emitting device of the first embodiment. However, the opening pattern of a resist mask for forming the dents 206 and the opening pattern of a resist mask for forming the lattice portion 205*a* are the patterns corresponding to the second embodiment.

Next, description will be made on the experiments of measuring an optical output of the light emitting device of the second embodiment. A method is used which is similar to the method used for the experiments of measuring the optical output of the light emitting device of the first embodiment. Similar to the first embodiment, the optical output was compared with that of the comparative example. An optical emission wavelength of the light emitting device of the second embodiment was 481 nm and the optical output was 145% that of the light emitting device of the comparative example.

Figure 9B:
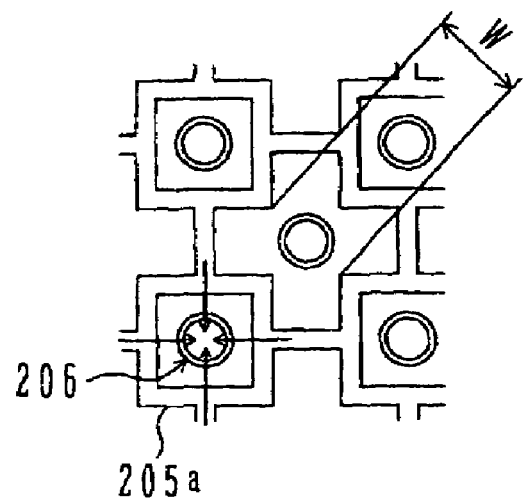
FIGS. 9B and 9C are schematic cross sectional views for explaining the operation and effects of a lattice portion of the light emitting device of the second embodiment.

Next, with reference to FIG. 9B, the operation and effects of the lattice portion 205*a* of the light emitting device of the second embodiment will be described.

Consider light emitted from the region of the optical emission layer 103 disposed under the coupling part of the lattice portion 205*a*. Consider that this region is divided into sub-regions along the longitudinal direction of the coupling part. Light emitted from each divided sub-region along the longitudinal direction of the coupling part is accumulated. It can therefore be considered that light emitted along the longitudinal direction of the coupling part becomes stronger than the light emitted along other directions. Light emitted from the region disposed under the linear portion of the p-side electrode along the longitudinal direction of the linear portion is referred to as "electrode parallel propagating light."

The dent 206 disposed in the square part connecting the above-described coupling parts is positioned on extension lines of these coupling parts. It can therefore be considered that the electrode parallel propagating light corresponding to these coupling parts is easily output from the sidewall of the dent 206. (See FIG. 9B.)

The coupling part defines the side shared by two adjacent crossed sections. The electrode parallel propagating light corresponding to the coupling part can be output from the dent 206 in the section surrounded by the square part adjacent to both these two adjacent crossed sections.

The wiring distance W of the square part is defined similar to the p-side electrode of the square matrix shape of the first embodiment (refer to FIG. 4A). In the region of the crossed section, a distance between the apexes of two square parts disposed on the diagonal line among four square parts surrounding the crossed section region is used as the wiring distance W.

Figure 9C:
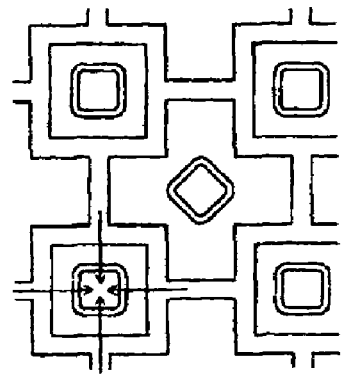

The opening of the dent may take various shapes other than a circle. For example, as shown in FIG. 9C, the opening shape of the dent may be approximately rectangular. Consider the dent having approximately the rectangular opening shape and disposed in the crossed section region. The dent is required to be disposed not to be superposed on the square parts surrounding the crossed section region.

If the side of the dent opening is parallel to the row or column direction along which the square parts are disposed, it is necessary to dispose the opening of the dent adjacent to the center of the crossed section as much as possible to avoid interference with the peripheral square parts. However, the corner of the opening of the dent is still likely to interfere with the square part, and it is difficult to broaden the opening of the dent. As shown in FIG. 9C, the dent opening can be easily broadened if the side of the dent opening is disposed obliquely (e.g., at an angle of 45°) relative to the row or column direction along which the square parts are disposed.

Figure 10A:
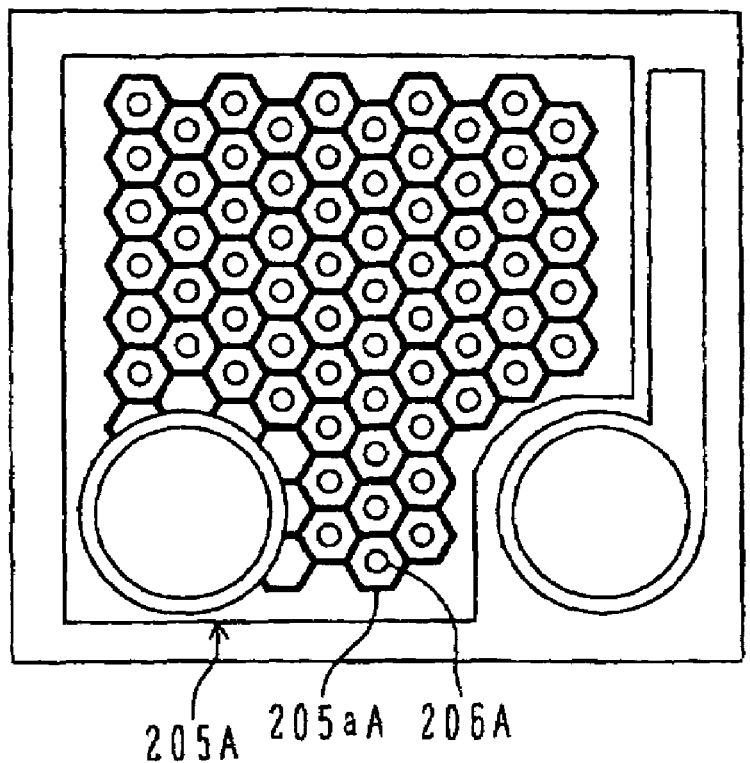
FIG. 10A is a schematic plan view of a light emitting device according to a modification of the second embodiment.

Next, with reference to FIG. 10A, a modification of the second embodiment will be described. FIG. 10A is a schematic plan view of the light emitting device of this modification. In this modification, the shape of the lattice portion 205aA of the p-side electrode 205A is a hexagonal lattice, and a dent 206A is disposed in each lattice.

Figure 10B:
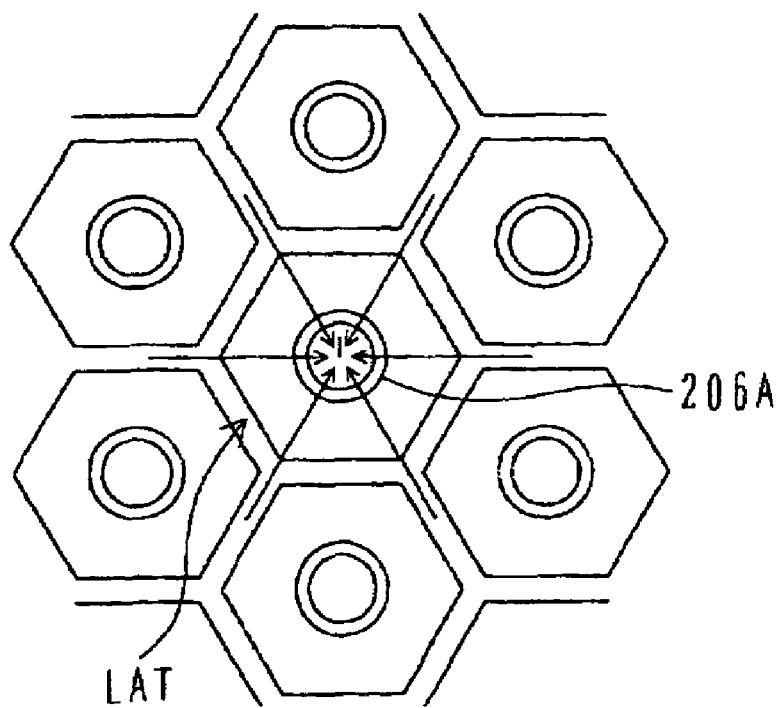
FIG. 10B is a schematic cross sectional view for explaining the operation and effects of a lattice portion of the light emitting device of the modification of the second embodiment.

As shown in FIG. 10B, the dent 206A in one hexagonal lattice LAT is disposed on extension lines of sides of six hexagonal lattices adjacent to the hexagonal lattice LAT. It can therefore be considered that the electrode parallel propagating light corresponding to the sides connected to the apexes of the hexagonal lattice LAT can be output easily from the sidewall of the dent 206A in the hexagonal lattice LAT.

The electrode parallel propagating light corresponding to the side shared by two adjacent hexagonal sections can be output from the dent 206A in the hexagonal section adjacent to both the two hexagonal sections.

Figure 11A:
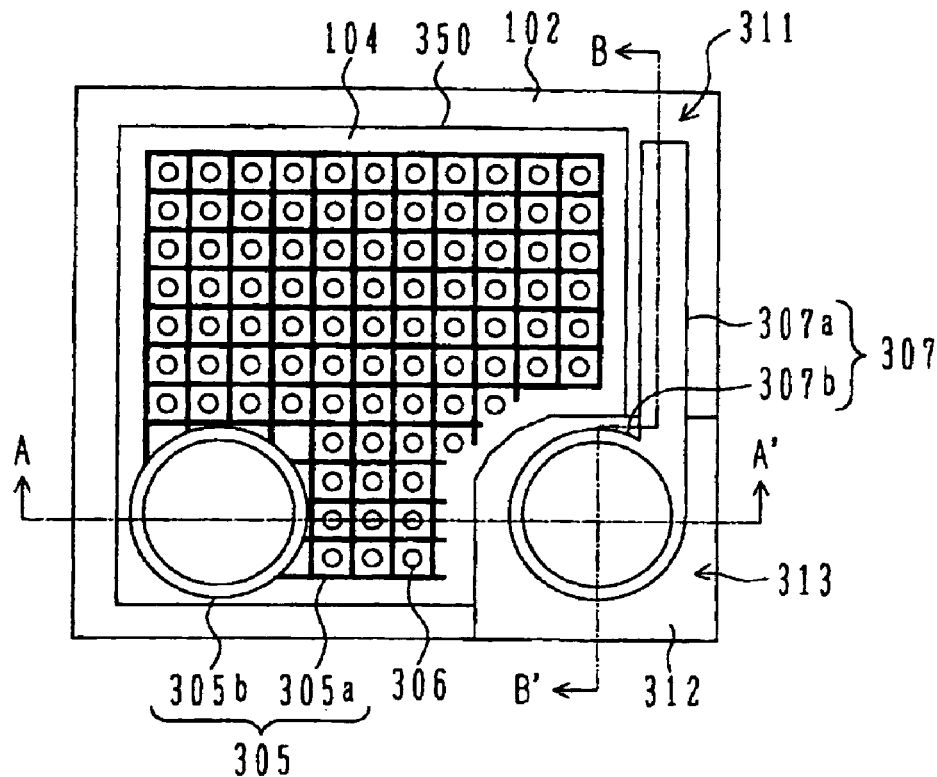
FIG. 11A is a schematic plan view of a light emitting device according to a third embodiment.
Figure 11B:
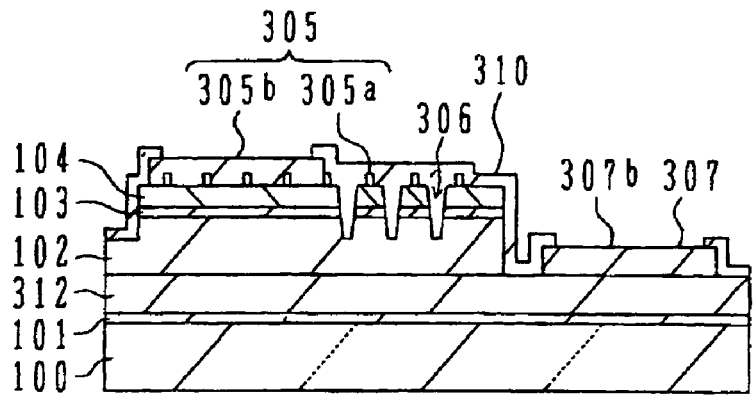
FIGS. 11B and 11C are schematic cross sectional views taken along the lines A-A' and B-B' shown in FIG. 11A, respectively.
Figure 11C:
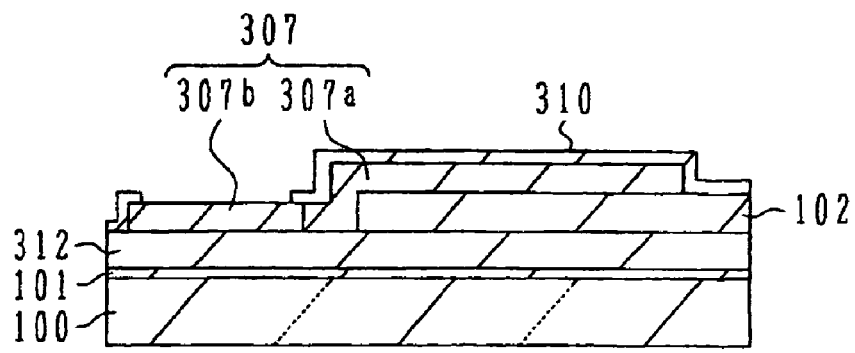

Next, with reference to FIGS. 11A to 11C, a light emitting device of a third embodiment will be described. FIG. 11A is a schematic plan view of the light emitting device of the third embodiment, and FIGS. 11B and 11C are schematic cross sectional views respectively taken along the lines A-A' and B-B' shown in FIG. 11A.

The light emitting device of this embodiment uses a nitride semiconductor wafer different from that used by the light emitting device of the first and second embodiments and comparative example. This nitride semiconductor wafer has a high resistance nitride semiconductor layer 312 between a buffer layer 101 and an n-type nitride semiconductor layer 102. The high resistance nitride semiconductor layer 312 has a resistivity higher than that of the n-type nitride semiconductor layer 102 and is not in ohmic contact with the n-side electrode. The high resistance nitride semiconductor layer 312 is formed by a film forming method similar to that used for forming the n-type nitride semiconductor layer 102 and the like.

A region 313 (n-side pad layout region 313) of a contour groove 311, where the a pad portion 307b of the n-side electrode 307 is disposed, is etched to the depth where the high resistance nitride semiconductor layer 312 is exposed. The n-side pad portion 307b is formed on the high resistance nitride semiconductor layer 312.

Similar to the light emitting devices of the first and second embodiments, an optical emission region 350 having a shape recessing one corner of a square is defined on the surface of a p-type nitride semiconductor layer 104. As shown in FIG. 11A, the recessed region of the optical emission region 350 overlaps the n-side pad layout region 313. The n-side pad portion 307b is disposed in the recessed region of the optical emission region 350.

A linear portion 307a of the n-side electrode 307 is formed on the n-type nitride semiconductor layer 102. A portion of the linear portion 307a where the pad portion 307b is connected, is formed on the high resistance nitride semiconductor layer 312. The other structures are similar to those of the light emitting device of the first embodiment.

Next, description will be made on the manufacture method for the light emitting device of the third embodiment. Similar to the manufacture method of the first embodiment described with reference to FIG. 2A, the contour groove 311 is formed. At this stage, however, the n-side pad layout region 313 has also the same depth as that of the other region of the contour groove 311 (the depth exposing the n-type nitride semiconductor layer 102 on the bottom). Next, dents 306 are formed by the method similar to that described with reference to FIG. 2B.

Figure 13A:
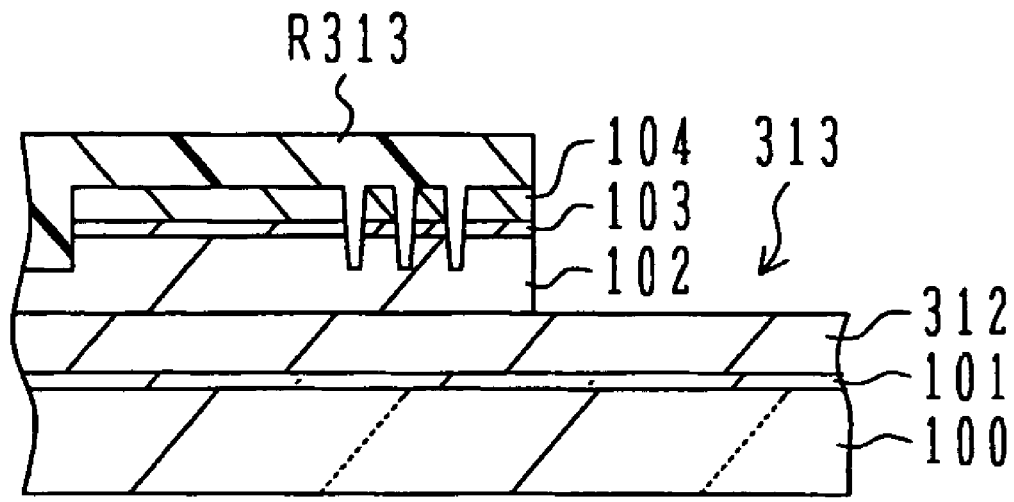
FIG. 13A is a schematic cross sectional view for explaining a manufacture method for the light emitting device of the third embodiment.

Next, as shown in FIG. 13A, a resist mask R313 is formed by photolithography, having an opening corresponding to the n-side pad layout region 313. Next, the n-type nitride semiconductor layer 102 in the opening of the resist mask R313 is removed by dry etching to expose the high resistance nitride semiconductor layer 312. Next, the resist mask R313 is washed and removed.

Next, a lattice portion 305a of the p-side electrode 305 is formed by a method similar to that described with reference to FIG. 2C.

Next, by a method similar to that described with reference to FIG. 3A, electrode material is vapor-deposited and the linear portion 307a and n-side pad portion 307b of the n-side electrode 307 are formed. The n-side pad portion 307b is therefore formed on the high resistance nitride semiconductor layer 312 and the linear portion 307a is therefore formed on the n-type nitride semiconductor layer 102.

Thereafter, a p-side pad portion 305b and a protective film 310 are formed by a method similar to that described with reference to FIGS. 3B and 3C.

Next, description will be made on the experiments of measuring an optical output of the light emitting device of the third embodiment. A method is used which is similar to the method used for the experiments of measuring the optical output of the light emitting device of the first embodiment. Similar to the first embodiment, the optical output was compared with that of the comparative example. An optical emission wavelength of the light emitting device of the third embodiment was 479 nm and the optical output was 170% that of the light emitting device of the comparative example.

In the light emitting device of the third embodiment, the n-side pad portion is formed on the high resistance nitride semiconductor layer. It can therefore be considered that current will not concentrate upon a region near the n-side pad portion as much as the light emitting devices of the first and second embodiments, increasing current flowing between the linear portion of the n-side electrode and the p-side electrode.

As a result, the region contributing to optical emission is broadened in the in-plane direction of the optical emission layer as compared with the case in which current concentrates upon the region near the n-side pad portion. Further, since current in the optical emission layer along the in-plane direction is made substantially uniform and the optical emission state is made substantially uniform, a variation in optical emission can be reduced.

There is a tendency that a region of the optical emission layer having a high current density is degraded. In the light emitting device of the third embodiment, current in the optical emission layer can be dispersed so that degradation of the light emitting device can be suppressed.

Figure 12A:
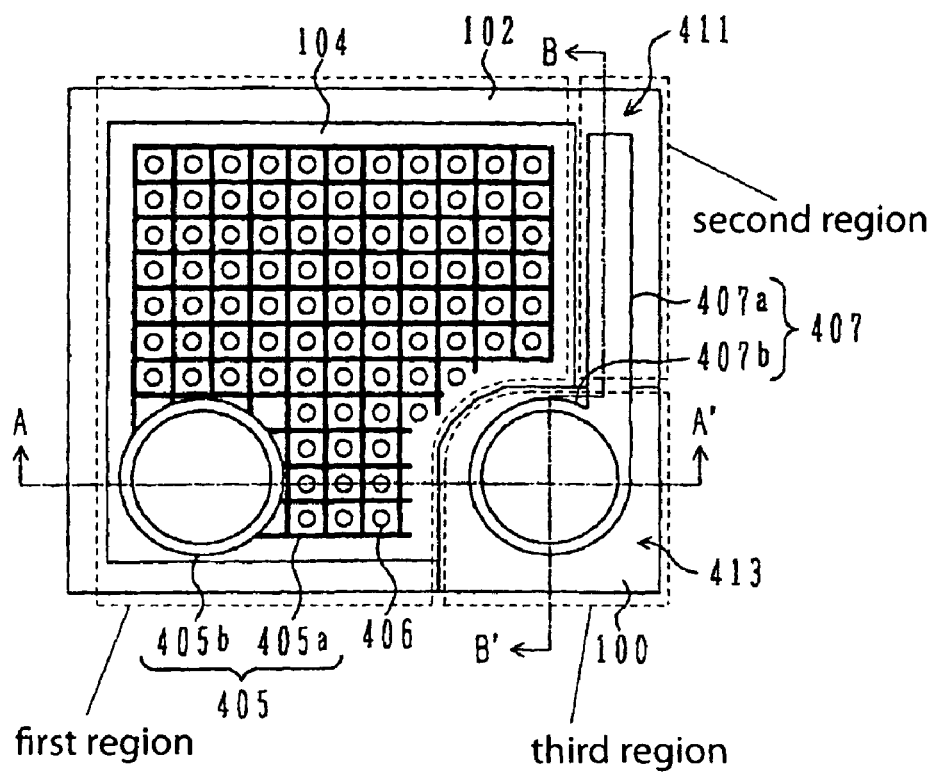
FIG. 12A is a schematic plan view of a light emitting device according to a fourth embodiment.
Figure 12B:
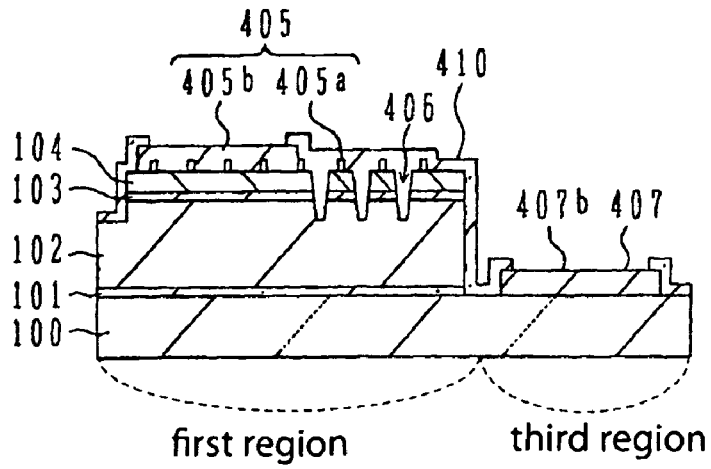
FIGS. 12B and 12C are schematic cross sectional views taken along the lines A-A' and B-B' shown in FIG. 12A, respectively.
Figure 12C:
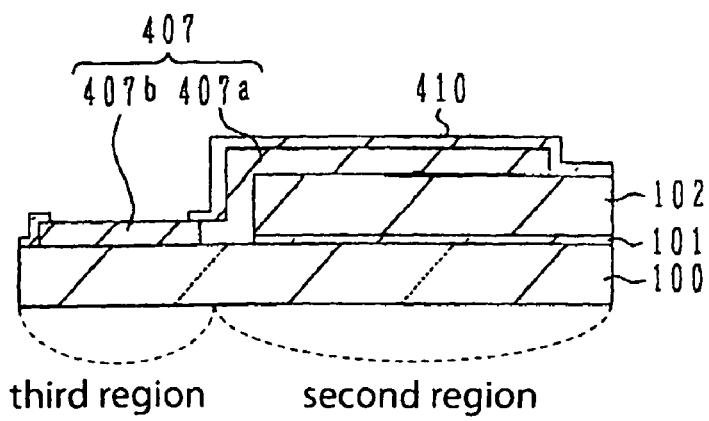

Next, with reference to FIGS. 12A to 12C, a light emitting device of a fourth embodiment will be described. FIG. 12A is a schematic plan view of the light emitting device of the fourth embodiment, and FIGS. 12B and 12C are schematic cross sectional views respectively taken along the lines A-A' and B-B' shown in FIG. 12A.

The light emitting device of this embodiment uses a nitride semiconductor wafer similar to that used by the light emitting devices of the first and second embodiments and comparative example.

In the light emitting device of this embodiment, a region 413 (n-side pad layout region 413) of a contour groove 411 where a pad portion 407b of the n-side electrode 407 is disposed, is etched to the depth where the substrate 100 is exposed. The n-side pad portion 407b is therefore formed on the substrate 100. For example, the substrate 100 is made of sapphire and is electrically insulative. A linear portion 407a of the n-side electrode 407 is formed on an n-type nitride semiconductor layer 102. A region of the linear potion 407a to which the pad portion 407b is coupled is formed on the substrate 100. The other structures are similar to those of the light emitting device of the first embodiment.

Next, description will be made on the manufacture method for the light emitting device of the fourth embodiment. By using a procedure similar to the manufacture method of the third embodiment, components up to dents 406 are formed.

Figure 13B:
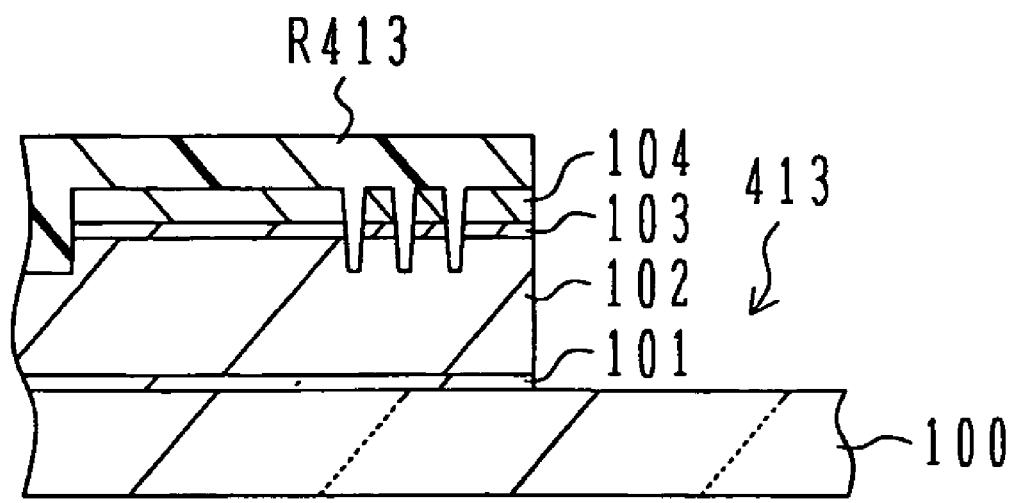
FIG. 13B is a schematic cross sectional view for explaining a manufacture method for the light emitting device of the fourth embodiment.

Next, as shown in FIG. 13B, a resist mask R413 is formed by photolithography, having an opening corresponding to the n-side pad layout region 413. Next, the n-type nitride semiconductor layer 102 and a buffer layer 101 in the opening of the resist mask R413 are removed by dry etching to expose the substrate 100. Next, the resist mask R413 is washed and removed.

Next, a lattice portion 405a of the p-side electrode 405 is formed by a method similar to that described with reference to FIG. 2C. Next, by a method similar to that described with reference to FIG. 3A, electrode material is vapor-deposited and the linear portion 407a and n-side pad portion 407b of the n-side electrode 407 are formed. The n-side pad portion 407b is therefore formed on the substrate 100 and the linear portion 407a is therefore formed on the n-type nitride semiconductor layer 102.

Thereafter, a p-side pad portion 405b and a protective film 410 are formed by a method similar to that described with reference to FIGS. 3B and 3C.

Next, description will be made on the experiments of measuring an optical output of the light emitting device of the fourth embodiment. A method is used which is similar to the method used for the experiments of measuring the optical output of the light emitting device of the first embodiment. Similar to the first embodiment, the optical output was compared with that of the comparative example. An optical emission wavelength of the light emitting device of the third embodiment was 480 nm and the optical output was 240% that of the light emitting device of the comparative example.

Similar to the light emitting device of the third embodiment, in the light emitting device of the fourth embodiment, it can be considered that there is an increase in current flowing between the linear portion of the n-side electrode and the p-side electrode. As a result, the region contributing to optical emission is broadened in the in-plane direction of the optical emission layer, increasing an optical emission output. Similar to the third embodiment, it is possible to reduce a variation in optical emission and suppress degradation of the optical emission layer. In the light emitting device of the fourth embodiment, it is not necessary to form a high resistance nitride semiconductor layer in the nitride semiconductor wafer.

Figure 14A:
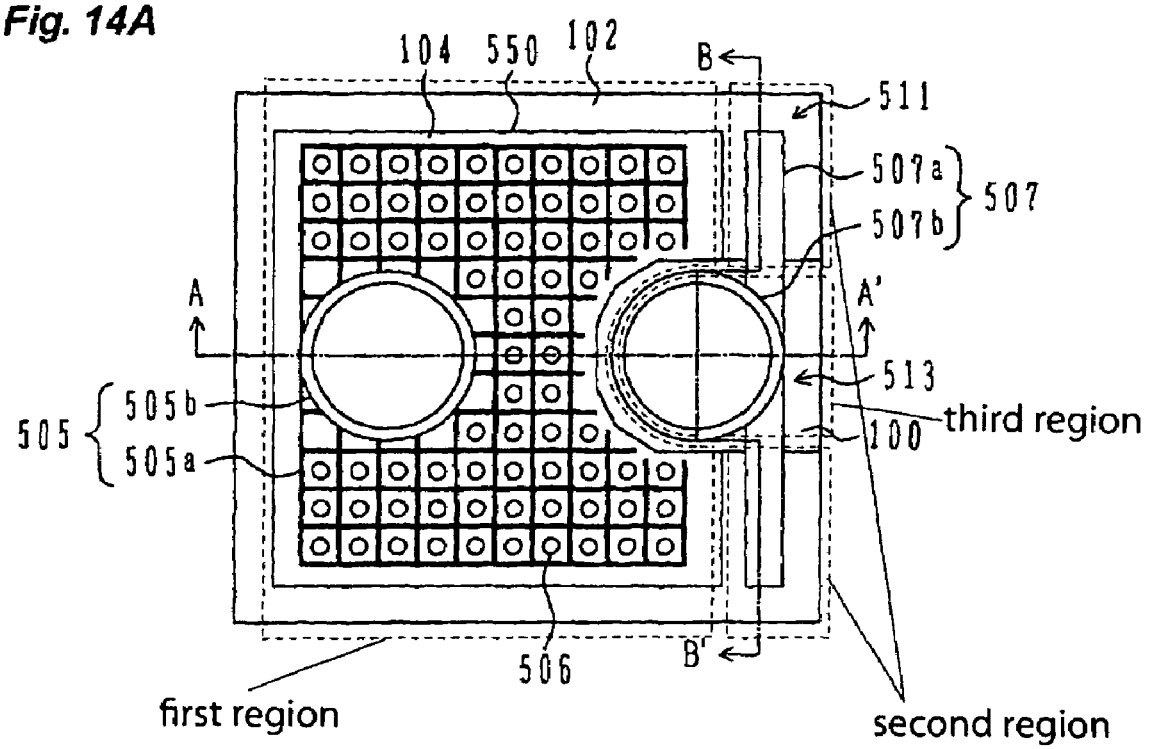
FIG. 14A is a schematic plan view of a light emitting device according to a fifth embodiment.
Figure 14B:
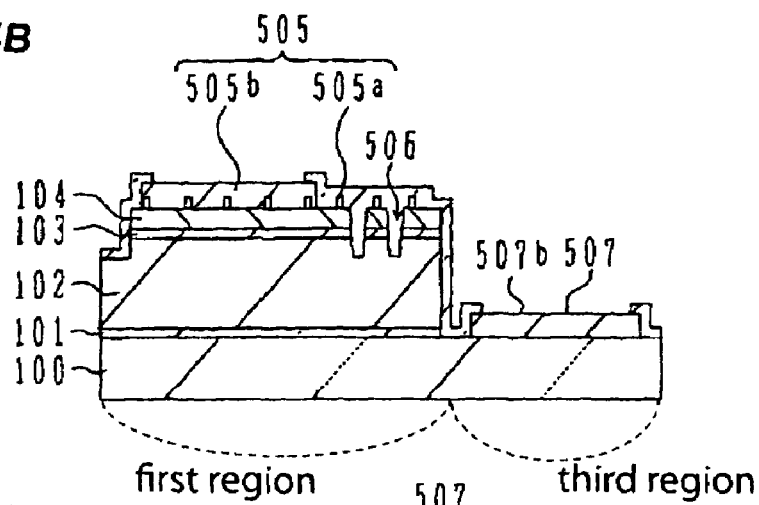
FIGS. 14B and 14C are schematic cross sectional views taken along the lines A-A' and B-B' shown in FIG. 14A, respectively.
Figure 14C:
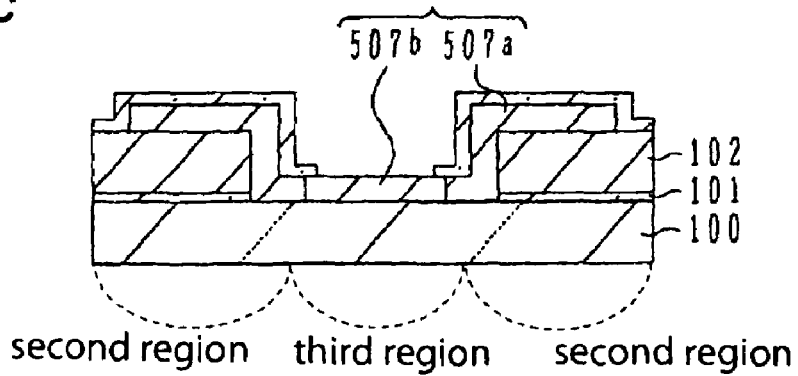

Next, with reference to FIGS. 14A to 14C, a light emitting device of a fifth embodiment will be described. FIG. 14A is a schematic plan view of the light emitting device of the fifth embodiment, and FIGS. 14B and 14C are schematic cross sectional views taken along the lines A-A' and B-B' shown in FIG. 14A.

The light emitting device of this embodiment has a different shape of an optical emission region and a different layout of p- and n-side pad portions, from those of the fourth embodiment.

In the light emitting device of the fifth embodiment, an optical emission region 550 having a shape of recessing a central area at one side of a square is formed on the surface of a p-type nitride semiconductor layer 104. An n-side pad portion 507b is disposed in the recessed area of the optical emission region 550. Similar to the fourth embodiment, a region 513 (n-side pad layout region 513) where the n-side pad portion 507b is disposed is etched to the depth where the substrate 100 is exposed. A linear portion 507a of the n-side electrode 507 is connected to the n-side pad portion 507b, and has an elongated shape along a direction parallel to one side of the optical emission region 550. The n-side pad portion 507b is formed on the substrate 100 and the linear portion 507a is formed on the n-type nitride semiconductor layer 102.

The p-side pad portion 505b is disposed on the optical emission region 550 near the central area of the side opposite to the recessed side. A lattice portion 505a of the p-side electrode 505 has a shape corresponding to the optical emission region 550. A dent 506 is disposed in each lattice of the lattice portion 505a.

The light emitting device of the fifth embodiment is manufactured by a method similar to the manufacture method for the light emitting device of the fourth embodiment. However, the opening patterns of the respective resist masks that define the patterns of various constituent elements (the contour groove 511 for defining the optical emission region 550, dents 506, the lattice portion 505a and p-side pad portion 505b of the p-side electrode 505, n-side pad layout portion 513, and the lattice portion 507a and n-side pad portion 507b of the n-side electrode 507) are modified so as to yield the arrangement depicted in FIG. 14A.

Next, description will be made on the experiments of measuring an optical output of the light emitting device of the fifth embodiment. A method is used which is similar to the method used for the experiments of measuring the optical output of the light emitting device of the first embodiment. Similar to the first embodiment, the optical output was compared with that of the comparative example. An optical emission wavelength of the light emitting device of the fifth embodiment was 482 nm and the optical output was 210% that of the light emitting device of the comparative example (FIG. 16). The light emitting device of the fifth embodiment has an optical emission output slightly lower than that of the light emitting device of the fourth embodiment.

Similar to the light emitting device of the third and fourth embodiments, in the light emitting device of the fifth embodiment, it can be considered. that there is an increase in current flowing between the linear portion of the n-side electrode and the p-side electrode. It can therefore be considered that the region contributing to optical emission is broadened in the in-plane direction of the optical emission layer, increasing an optical emission output. Similar to the third and fourth embodiments, it is possible to reduce a variation in optical emission and suppress degradation of the optical emission layer.

Figure 15A:
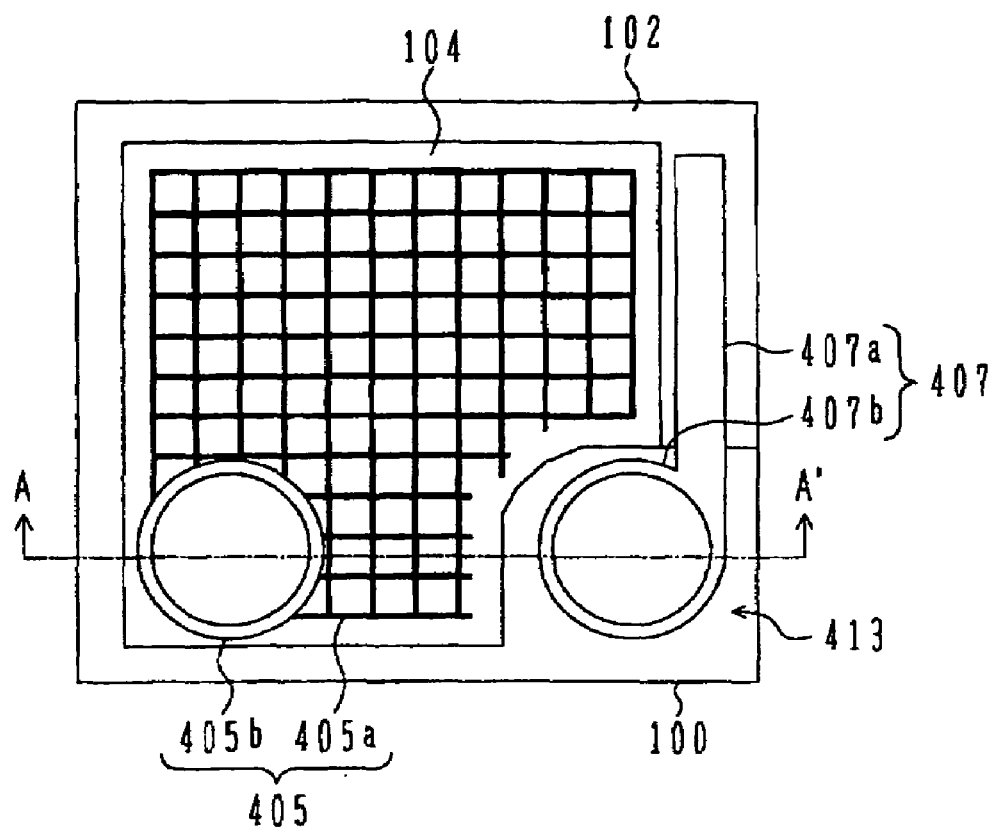
FIG. 15A is a schematic plan view of a light emitting device according to a sixth embodiment.
Figure 15B:
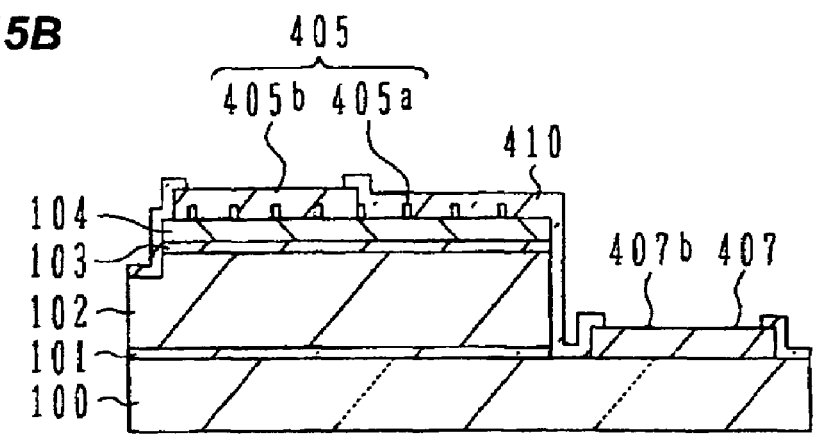
FIG. 15B is a schematic cross sectional view taken along the line A-A' shown in FIG. 15A.

Next, with reference to FIGS. 15A and 15B, a light emitting device of a sixth embodiment will be described. FIG. 15A is a schematic plan view of the light emitting device of the sixth embodiment, and FIG. 15B is a schematic cross sectional view taken along the lines A-A' shown in FIG. 15A. The light emitting device of the sixth embodiment has a structure that the dents 406 are removed from the light emitting device of the fourth embodiment. In the manufacture method for the light emitting device of the sixth embodiment, the process of forming the dents 406 is omitted from the manufacture processes of the light emitting device of the fourth embodiment.

Next, description will be made on the experiments of measuring an optical output of the light emitting device of the sixth embodiment. A method is used which is similar to the method used for the experiments of measuring the optical output of the light emitting device of the first embodiment. Similar to the first embodiment, the optical output was compared with that of the comparative example. An optical emission wavelength of the light emitting device of the sixth embodiment was 480 nm and the optical output was 120% that of the light emitting device of the comparative example (FIG. 16).

Similar to the light emitting device of the fourth embodiment, in the light emitting device of the sixth embodiment, it can be considered that there is an increase in current flowing between the linear portion of the n-side electrode and the p-side electrode. It can therefore be considered that the region contributing to optical emission is broadened in the in-plane direction of the optical emission layer, increasing an optical emission output. It is also possible to reduce a variation in optical emission and suppress degradation of the optical emission layer.

Figure 17A:
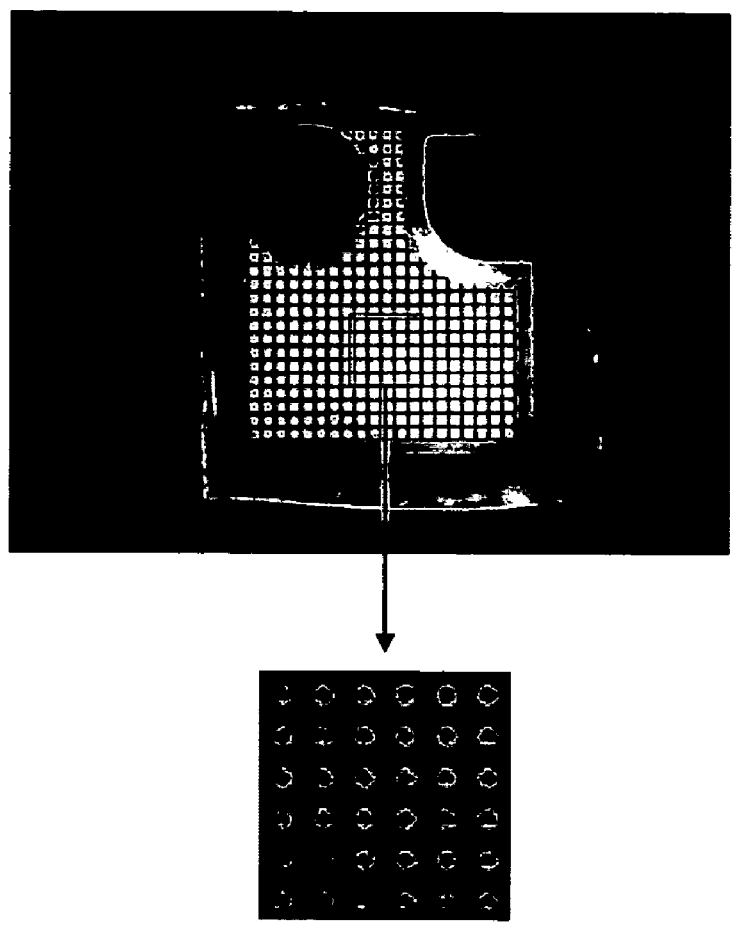
FIG. 17A is a photograph showing an optical emission state of the light emitting device of the fourth embodiment.
Figure 17B:
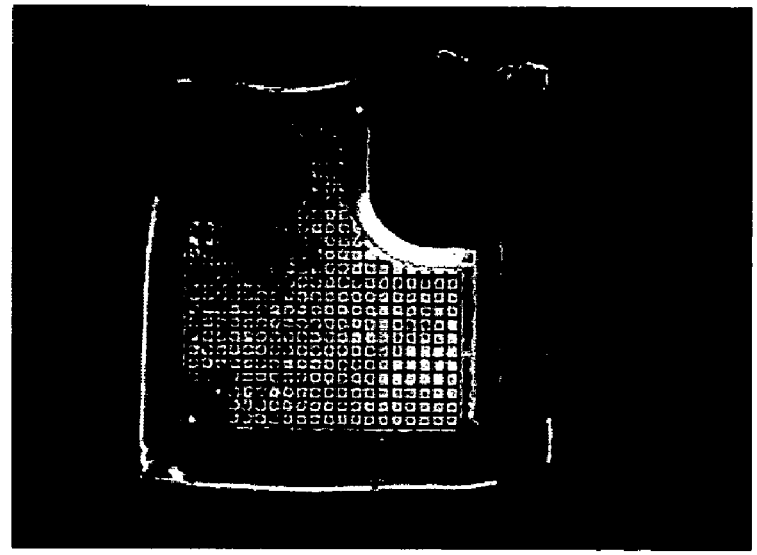
FIG. 17B is a photograph showing an optical emission state of the light emitting device of the sixth embodiment.

FIG. 17A is a photograph showing an optical emission state of the light emitting device of the fourth embodiment, and a lower photograph of FIG. 17A shows an enlargement view of the optical emission state shown in the upper photograph of FIG. 17A in the region near dents. FIG. 17B is a photograph showing an optical emission state of the light emitting device of the sixth embodiment. The light emitting device of the sixth embodiment has the structure that the dents are removed from the light emitting device of the fourth embodiment. The luminance in the upper surface of the light emitting device of the fourth embodiment is stronger than that of the light emitting device of the sixth embodiment. As seen from the enlarged photograph shown in the lower area of FIG. 17A, light is output upward from the sidewalls of the dents.

Next, with reference to FIG. 18, description will be made on experiments of evaluating the effects of the protective film. A temporal change in the optical emission output was evaluated for the light emitting device of the fourth embodiment and the light emitting device of the fourth embodiment with the protective film being removed.

Figure 18:
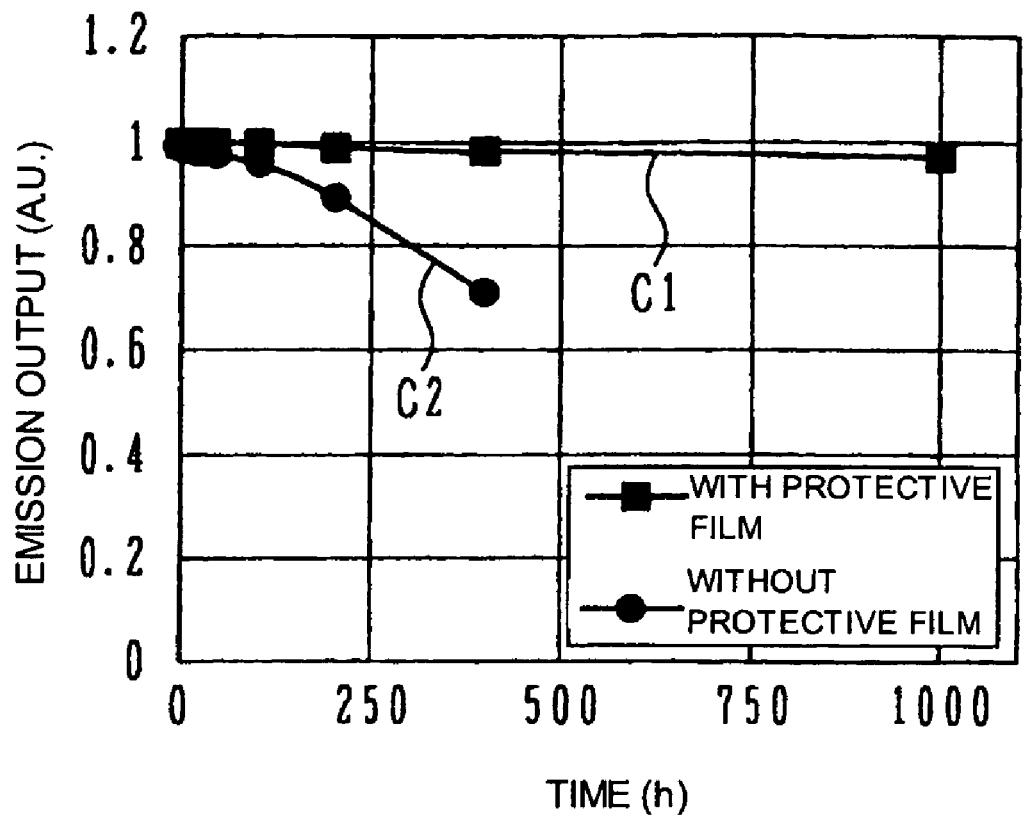
FIG. 18 is a graph showing the results of experiments evaluating the effects of a protective film.

The abscissa of the graph shown in FIG. 18 represents a time, and the ordinate represents the optical emission output. The curve C1 indicates the effects with the protective film and the curve C2 indicates the effects without the protective film. The optical emission output without the protective film decreased by about 70% from the initial optical emission output in about 400 hours, and the output of the device with the protective film was maintained to about 95% of the initial optical emission output even after a lapse of 1000 hours. Therefore, the protective film suppresses temporal degradation of an optical emission output.

Light can be output effectively by progressively narrowing, from the bottom to the top, the width of side surfaces of the devices that expose the p-type nitride semiconductor layer, optical emission layer 103 and n-type nitride semiconductor layer. This can be achieved, for example, by inwardly inclining the side surfaces of the device by about 3° to about 13° relative to the normal to the upper surface of the p-type nitride semiconductor layer 104.

In the above-described embodiments, although the shape of each section surrounded by the lattice portion of the p-side electrode is a polygon such as a square, each section may have a shape different from a polygon. Depending on the design needs and ease in manufacture, it may be sufficient if the lattice portion has a meshed shape dividing the surface of the p-type nitride semiconductor layer into a plurality of sections. A dent is formed in each section defined by the lattice portion in such a manner that the upper edge of the opening is spaced from the lattice portion. Further a plurality of dents may be disposed in each section.

In the above-described first to fourth, and sixth embodiments, although the shape of the optical emission region as viewed from the top is a square with a recessed corner, the shape of the optical emission region is not limited to the square, but it may be a quadrilateral, including, but not limited to, a rectangle and a parallelogram.

The present invention has been described in connection with the preferred embodiments. The invention is not limited only to the above embodiments. It will be apparent to those skilled in the art that other various modifications, improvements, combinations, and the like can be made.

What we claim are:

1. A light emitting device comprising:
    a lower semiconductor layer of a first conductivity type;
    an optical emission layer formed on said lower semiconductor layer;
    an upper semiconductor layer of a second conductivity type opposite to said first conductivity type, said upper semiconductor layer being formed on said optical emission layer;
    a lower side electrode electrically connected to said lower semiconductor layer; and
    an upper side electrode electrically connected to said upper semiconductor layer,
    wherein said upper side electrode is formed on said upper semiconductor layer, and said upper semiconductor layer has a mesh pattern defining a plurality of sections each surrounded by said upper side electrode, and
    wherein at least one dent is disposed in at least one of said sections, said dent having a bottom reaching at least an upper surface of said lower semiconductor layer and having an opening with an upper edge spaced apart from said upper side electrode.

2. The light emitting device according to claim 1, wherein the bottom of said dent is disposed between the upper surface and a lower surface of said lower semiconductor layer.

3. The light emitting device according to claim 1, wherein said dent has a shape broadening progressively from a lower position toward an upper position.

4. The light emitting device according to claim 3, wherein a sidewall of said dent has an inclination angle of about 12° or smaller relative to a normal to the upper surface of said upper semiconductor layer.

5. The light emitting device according to claim 1, further comprising a substrate disposed below said lower semiconductor layer, and a distance from the bottom of said dent to the substrate is about 1 μm or longer.

6. The light emitting device according to claim 1, wherein the bottom of said dent is an upward convex shape.

7. The light emitting device according to claim 1, wherein a shortest distance from the upper edge of the opening of said dent to said upper side electrode is about 2 μm or longer.

8. The light emitting device according to claim1, wherein an area of the opening of said dent formed in one of said sections is in a range of about 7% to about 50% an area of said one section.

9. The light emitting device according to claim 1, wherein a line width of a portion of the mesh pattern of said upper side electrode is about 5 μm or narrower.

10. The light emitting device according to claim 1, wherein a shape of each of said sections is a polygon, and said dent is disposed in a first section on a virtual line extending from a side shared by second and third sections that are adjacent to the first section.

11. The light emitting device according to claim 1, wherein a material of said upper side electrode contains at least one of platinum, palladium, iridium and rhodium.

12. The light emitting device according to claim 1, wherein said upper side electrode includes a first metal layer formed over said upper semiconductor layer and a second metal layer formed above said upper semiconductor layer and covering said first metal layer,
wherein a reflectivity that is defined as a reflectivity with respect to light emitted from said optical emission layer at an interface between said upper semiconductor layer and said first metal layer if such an interface is to be formed is higher than a reflectivity that is defined as a reflectivity with respect to said light at an interface between said upper semiconductor layer and said second metal layer if such an interface is to be formed, and
wherein said first metal layer includes a layer of Ag or a layer of alloy containing Ag.

13. The light emitting device according to claim 12, wherein said second metal layer contains at least one of platinum, palladium, iridium and rhodium.

14. The light emitting device according to claim 1, further comprising an insulating film formed at least on a sidewall of said dent so as to cover said lower semiconductor layer, said optical emission layer and said upper semiconductor layer that are exposed at the sidewall due to said dent, said insulating film being substantially transparent to light emitted from said optical emission layer.

15. The light emitting device according to claim 14, wherein said insulating film has a thickness of about 100 nm to about 500 nm.

16. The light emitting device according to claim 14, wherein said insulating film contains at least one of silicon oxide, titanium oxide, aluminum oxide, zirconium oxide, hafnium oxide, neodymium oxide, erbium oxide and cerium oxide.

17. The light emitting device according to claim 16, wherein said insulating film covers at least a portion of said upper side electrode, and
wherein an uppermost layer of said upper side electrode covered with said insulating film contains at least one of titanium, nickel and aluminum.

18. The light emitting device according to claim 1, wherein said lower semiconductor layer, said optical emission layer and said upper semiconductor layer are made of nitride semiconductor, and said lower semiconductor layer and said upper semiconductor layer have n- and p-type conductivities, respectively.

19. A light emitting device comprising:
a first region including a support layer, a lower semiconductor layer of a first conductivity type, formed above said support layer and having a resistivity lower than a resistivity of said support layer, an optical emission layer formed over said lower semiconductor layer, an upper semiconductor layer of a second conductivity type opposite to said first conductivity type, the upper semiconductor layer being formed over said optical emission layer, and an upper side electrode formed on said upper semiconductor layer;
a second region including said support layer, said lower semiconductor layer formed above said support layer, and a first portion of a lower side electrode formed on said lower semiconductor layer; and
a third region including said support layer and a second portion of said lower side electrode formed on said support layer,
wherein said upper side electrode includes a portion having a mesh pattern defining a plurality of sections each surrounded by said upper side electrode, and
wherein a dent is disposed in at least one of said sections, said dent having a bottom reaching at least an upper surface of said lower semiconductor layer and having an opening with an upper edge spaced apart from said upper side electrode.

20. The light emitting device according to claim 19, wherein as viewed from the top, said first region is a quadrilateral with one corner cut out to form a recess, said third region being disposed adjacent said recess, and
wherein said second portion of said lower side electrode in said third region has a portion adapted to form a pad.

21. The light emitting device according to claim 19, further comprising an insulating film formed at least on a sidewall of said dent so as to cover said lower semiconductor layer, said optical emission layer, and said upper semiconductor layer that are exposed at the sidewall due to said dent, said insulating film being substantially transparent to light emitted from said optical emission layer.

22. The light emitting device according to claim 21, wherein said insulating film has a thickness of about 100 nm to about 500 nm.

23. The light emitting device according to claim 21, wherein said insulating film contains at least one of silicon oxide, titanium oxide, aluminum oxide, zirconium oxide, hafnium oxide, neodymium oxide, erbium oxide and cerium oxide.

24. The light emitting device according to claim 23, wherein said insulating film covers said lower side electrode excepting a portion of an upper surface of said lower side electrode, and covers said upper side electrode excepting a portion of an upper surface of said upper electrode, and
wherein an uppermost layer of said upper side electrode covered with said insulating film contains at least one of titanium, nickel and aluminum.

25. The light emitting device according to claim 19, wherein said lower semiconductor layer, said optical emission layer and said upper semiconductor layer are made of nitride semiconductor, and said lower semiconductor layer and said upper semiconductor layer have n- and p-type conductivities, respectively.

26. The light emitting device according to claim 1, wherein said upper side electrode is opaque.

27. The light emitting device according to claim 19, wherein said upper side electrode is opaque.

* * * * *